(12) United States Patent
Smith et al.

(10) Patent No.: US 11,035,820 B2
(45) Date of Patent: Jun. 15, 2021

(54) CARBON NANOFIBER SENSOR FOR NON-ENZYMATIC GLUCOSE DETECTION AND METHODS OF GLUCOSE DETECTION USING SUCH CARBON NANOFIBER SENSOR

(71) Applicant: Tuskegee University, Tuskegee, AL (US)

(72) Inventors: Tamara Floyd Smith, Tuskegee, AL (US); Julaunica Tigner, Tuskegee, AL (US); Jessica Koehne, Tuskegee, AL (US)

(73) Assignee: Tuskegee University, Tuskegee, AL (US)

( * ) Notice: Subject to any disclaimer, the term of this patent is extended or adjusted under 35 U.S.C. 154(b) by 24 days.

(21) Appl. No.: 16/364,694

(22) Filed: Mar. 26, 2019

(65) Prior Publication Data

US 2019/0310223 A1    Oct. 10, 2019

Related U.S. Application Data

(60) Provisional application No. 62/655,565, filed on Apr. 10, 2018.

(51) Int. Cl.
| | | |
|---|---|---|
| *G01N 27/327* | (2006.01) | |
| *G01N 27/30* | (2006.01) | |
| *C23F 17/00* | (2006.01) | |
| *C23C 16/26* | (2006.01) | |

(52) U.S. Cl.
CPC ......... *G01N 27/3278* (2013.01); *C23C 16/26* (2013.01); *C23F 17/00* (2013.01); *G01N 27/308* (2013.01); *G01N 27/3277* (2013.01)

(58) Field of Classification Search
None
See application file for complete search history.

(56) References Cited

FOREIGN PATENT DOCUMENTS

CN    101603941 A  * 12/2009

OTHER PUBLICATIONS

D. Ye, et al. "A novel nonenzymatic sensor based on CuO nanoneedle/graphene/carbon nanofiber modified electrode for probing glucose in saliva", Talanta, 116, p. 223-230, Nov. 2015.*
J. Zhang, et al. "In situ growth cupric oxide nanoparticles on carbon nanofibers for sensitive nonenzymatic sensing of glucose", Electrochimica Acta, 105, p. 433-438, Aug. 2013.*

(Continued)

*Primary Examiner* — J. Christopher Ball
(74) *Attorney, Agent, or Firm* — Beusse Sanks, PLLC

(57) ABSTRACT

A general methodology for the development of sensitive and selective sensors that can achieve a low cost detection of glucose without using enzymes is disclosed. The method uses carbon nanofiber (CNF) array electrodes for the electrochemical detection of glucose. CNFs grown by plasma enhanced chemical vapor deposition (PECVD) with diameters ranging from 13-160 nm and a height of approximately one micrometer are preferred. The CNFs have a sensitivity of 2.7 µA/mM cm$^2$ and detection limit of 2 mM. Also provided are methods of preparing the CNF sensors and kit components. Methods of using such CNF sensors for detecting target agents, particularly glucose, are also provided.

13 Claims, 24 Drawing Sheets
(20 of 24 Drawing Sheet(s) Filed in Color)

(56) References Cited

OTHER PUBLICATIONS

A.M. Cassell, et al. "Combinatorial chips for optimizing the growth and integration of carbon nanofiber based devices", Nanotechnology, 15(1): p. 9-15, Nov. 2015.*

Z. Miao, et al. "Non-enzymatic Hydrogen Peroxide Sensors Based on Multi-wall Carbon Nanotube/Pt Nanoparticle Nanohybrids", Materials, 7(4): p. 2945-2955, Apr. 2014.*

R.K. Shervedani, et al., "Prickly nickel nanowires grown on Cu substrate as a supersensitive enzyme-free electrochemical glucose sensor," Sensors and Actuators B 204 (2014) pp. 783-790.

K. Li, et al., "Novel ultrasensitive non-enzymatic glucose sensors based on controlled flower-like CuO hierarchical films," Sensors and Actuators B 199 (2014) pp. 175-182.

Aliakbar Tarlani, et al., "New ZnO nanostructures as non-enzymatic glucose biosensors," Biosensors and Bioelectronics, pp. 1-7.

Taher Alizadeh, et al., "A Nafion-free non-enzymatic amperometric glucose sensor based on copper oxide nanoparticles-graphene nanocomposite," Sensors and Actuators B 198 (2014) pp. 438-447.

S. Sainio, et al., "What Does Nitric Acid Really Do to Carbon Nanofibers?," The Journal of Physical Chemistry C 2016, 120, pp. 22655-22662.

Kang, X., Mai. Z., Zou, X., Cai, P., Mo, J. (2007). A sensitive nonenzymatic glucose sensor in alkaline media with a copper nanocluster/multiwall carbon nanotube-modified glassy carbon electrode. Analytical Biochemistry, 363 (2017) 143-150.

Wang, W., Li, Z., Yang, J., Zhang, H., Wang, C. (2009). Electrospun palladium (IV)-doped copper oxide composite nanofibers for non-enzymatic glucose sensors. Electrochemistry Communications, 11 (2009) 1811-1814.

Fan, Z., Liu, B., Liu, X., Li, Z., Wang, H., Yang, S., Wang, J. (2013). A flexible and disposable hybrid electrode based on Cu nanowires modified graphene transparent electrode for non-enzymatic glucose biosensor. Electrochimica Acta, 109 602-608.

Yuan, B., Xu, C., Deng, D., Xing, Y., Liu, L., Pang, H., Zhang, D. (2013). Graphene oxide/nickel oxide modified glassy carbon electrode for supercapacitor and nonenzymatic glucose sensor. Electrochimica Acta, 88, 708-712.

Zhang, Y., et al. (2014). CuO nanowires based sensitive and selective non-enzymatic glucose detection. Sensors and Actuators B: Chemical, 191, 86-93.

Ismail, N. S., et al. (2014). Development of Non-enzymatic Electrochemical Glucose Sensor Based on Graphene Oxide Nanoribbon-Gold Nanoparticle Hybrid. Electrochimica Acta, 146, 98-105.

Zhao, Y., et al. (2014). High-power non-enzymatic glucose biofuel cells based on three-dimensional platinum nanoclusters immobilized on multiwalled carbon nanotubes. Electrochimica Acta, 145, 159-169.

Kiani, M. A., et al. (2014) Reusable and robust high senstivite non-enzymatic glucose sensor based on Ni(OH)2 nanoparticles. Analytica Chimica Acta, 839, 26-33.

Dhara, K., et al. (2014). Pt—CuO nanoparticles decorated reduced graphene oxide for the fabrication of highly sensitive non-enzymatic disposable glucose sensor. Sensors and Actuators B: Chemical, 195, 195-205.

Koehne, J. E., et al. (2004) Miniaturized multiplex label-free electronic chip for rapid nucleic acid analysis based on carbon nanotube nanoelectrode arrays. Clinical Chemistry 2004 50 No. 10 1886-1893.

Wang, S. G., et al. (2003). A novel multi-walled carbon nanotube-based biosensor for glucose detection. Biochemical and Biophysical Research Communications, 311, 572-576.

Lin, Y., et al. (2004). Glucose Biosenesors Based on Carbon Nanotube Nanoelectrode Ensembles. Nano Letters, 4, 191-195.

Pham, X.H., et al. (2010). Electrochemical characterization of a single-walled carbon nanotube electrode for detection of glucose. Analytica Chimica Acta, 671, 36-40.

Koehne, J.E., et al. (2004). The fabrication and electrochemical characterization of carbon nanotube nanoelectrode arrays. Journal of Material Chemistry, 14, 676-684.

Arumugam, P.U., et al. (2010). Vertically aligned carbon nanofiber electrode arrays for nucleic acid detection. Chemical Physics Letters, 499, 241-246.

Nguyen-Vu, T. D. B., et al. (2006). Vertically Aligned Carbon Nanofiber Arrays: An Advance toward Electrical-Neural Interfaces. Small, 2, No. 1 89-94.

* cited by examiner

CARBON NANOFIBER SENSOR FOR NON-ENZYMATIC GLUCOSE DETECTION AND METHODS OF GLUCOSE DETECTION USING SUCH CARBON NANOFIBER SENSOR

RELATED APPLICATIONS

This application claims priority to U.S. Provisional Application 62/655,565, filed Apr. 10, 2018, which application is herein incorporated by reference in its entirety.

This invention was made with government support under contract 39 22460-041 awarded by NASA. The government has certain rights in the invention.

FIELD OF THE INVENTION

The present invention relates to glucose detection sensors, and specifically to a carbon nanofiber sensor ("CNF") for non-enzymatic glucose detection. This application relates to the CNF sensors, kits that include such sensors, and methods for making and using such sensor. The CNF sensor permits detection of glucose in a fluid.

BACKGROUND

Diabetes is a disease that results in high levels of glucose in the body. As a result of high glucose levels, patients are at high risk for serious health complications such as blindness, kidney failure, heart disease, stroke, amputation of extremities, and possibly death (American Diabetes Association 2015). Diagnosis and management of diabetes have benefitted greatly from the invention of glucose biosensors, which were first proposed in 1962 by Dr. Leland C. Clark Jr., known as the father of the biosensor, and Dr. Champ Lyons.

Since the first glucose biosensor proposed in 1962, which was an amperometric enzyme glucose detection device (Clarke and Foster 2012), the working principle was that a decrease in oxygen concentration is proportional to the glucose concentration. Glucose sensors are essential for diabetes management. By 2008, the glucose sensor had moved from the concept stage to a critical technology with an $8.8 billion market for the management of diabetes (Hughes 2009). The current state of the disease in the United States is that one out of eleven have been diagnosed (~29.1 million) with diabetes and one out of four are undiagnosed in the United States (Center for Disease Control and Prevention 2011). Individuals living with diabetes have to monitor their glucose levels and commonly use a glucose biosensor. The current, most prevalent, technology is based on the electrochemical detection of glucose using the enzyme, glucose oxidase.

The development of a glucose sensor platform and device for quantification of glucose can realize a much needed improvement upon the state-of-the-art by using non-enzymatic detection. Non-enzymatic detection avoids the expense as well as chemical and thermal instability of enzymes (Alizadeh and Mirzagholipur 2014). The benefit of the enzyme is that it improves the selectivity and sensitivity of the electrode. Therefore, the challenge is to develop a valuable, non-enzymatic sensor and supporting technology while retaining the attributes of sufficient selectivity and sensitivity to allow for qualitative results.

The glucose sensor platform of this invention is based on the electrochemical detection of glucose using carbon-based materials. Carbon, as an electrode material, has low electric resistance, wide potential window range, and good biocompatibility. Carbon nanofiber sensors ("CNFs") were selected for development because of the ease of fabrication, high surface area and complex structure, which can lead to significantly enhanced sensitivity and faster reaction rates. Glassy carbon, a very common carbon-based material, was chosen as a benchmark to compare the novel CNF sensor platform.

There has been significant development and use of glucose biosensors in the clinical setting. A biosensor is a device or system composed of three major components. These components are biological recognition elements that identify and target molecules in the presence of interfering compounds, a transducer that produces a measurable signal, and a signal processing system that provides a read out of the signal (Yoo and Lee 2010). For example, biological molecular recognition elements used included "receptors, enzymes, antibodies, nucleic acids, microorganisms and lectins" (Yoo and Lee 2010). Additionally, the transducers may be chosen from five principal classes: electrochemical, optical, thermometric, piezoelectric, and magnetic (Yoo and Lee 2010). The majority of the current biosensors use electrochemical transducers due to the advantages of improved sensitivity, repeatability, ease of maintenance and lower cost.

Electrochemical biosensor may be divided into three subcategories based on the following types of operation: potentiometric, amperometric, and conductometric. Of the three groups, enzyme amperometric glucose biosensors are the most common devices commercially available (Yoo and Lee 2010). These glucose biosensors have been studied for decades. In the amperometic glucose biosensor, the functional working principle of this biosensor is to monitor the current generated when electrons are exchanged directly or indirectly between the biological system and electrode (Yoo and Lee 2010). There are three enzymes that could be used for the detection of glucose: hexokinase, glucose oxidase, and glucose-1-dehydrogenase. The hexokinase assay, which is used in many clinical laboratories, is a method that measures glucose via spectrophotometry (Yoo and Lee 2010). However, enzymes glucose oxidase and glucose-1-dehydrogenase are currently being used in commercially available glucose biosensors. The advantages of using glucose oxidase are that it is easy to obtain, cheaper and can withstand extreme pH conditions, ionic strength, and temperature relative to many other enzymes, which allows less stringent conditions during the manufacturing process and relatively relaxed storage norms for use by patients without specialized training in handling of biosensors (Yoo and Lee 2010). The basic concept of glucose biosensor measurements consists of immobilization of the glucose oxidase which catalyzes the oxidation of β-D-glucose by molecular oxygen producing gluconic acid and hydrogen peroxide; thus, in order for this reaction to proceed, a redox cofactor flavin adenine dinucleotide (FAD) works as the initial electron acceptor and is reduced to FADH2 (Yoo and Lee 2010).

During the last decade, biosensors that do not rely on an enzyme for the detection of glucose have gained significant attention. Kang et al. (2007) conducted a study on the sensitivity of a nonenzymatic glucose sensor in alkaline media with a copper nanocluster multiwall carbon nanotube-modified GCE. The objective of the study was to develop and characterize copper nanocluster multiwall carbon nanotube (MWCNT)-modified GCEs for glucose detection. The electrode was characterized using transmission electron microscopy (TEM), x-ray diffraction (XRD), CV, and EIS. The electrochemical testing was conducted with a three electrode system with the modified GCE as the working electrode, Ag/AgCl (3 M KCl) as the reference electrode, and a platinum wire as the counter electrode. The research team achieved a sensitivity of 17.76 µA/mM with a detection limit of $2.1 \times 10^{-7}$ M and response time of 5 s.

Wang et al. (2009) developed electrospun palladium (IV)-doped copper oxide composite nanofibers for non-enzymatic glucose sensors. The objectives of this study were to fabricate, characterize, and analyze palladium (IV)-doped copper oxide composite nanofibers (PCNFs). The CV data showed for both copper oxide and PCNFs a single forward oxidative wave (Wang et al. 2009). The copper oxide nanofibers oxidation started at +0.15 V with the shoulder peak at +0.4 V and the PCNFs oxidation started at 0.08 V with broad oxidation wave centers at +0.32 V (Wang et al. 2009). The author attributed the improvement in the electrocatalytic activity of the PCNFs to palladium sites in the PCNFs. The PCNFs was able to achieve a sensitivity 1061.4 µA/mM·cm$^2$ and detection limit of $1.9 \times 10^{-8}$ M with signal to noise ratio of 3.

Fan et al. (2013) created a flexible and disposable hybrid electrode based on a copper nanowire-modified graphene transparent electrode for non-enzymatic glucose sensing. For the Cu NWs CV, no current response was observed with or without the addition of glucose. The Cu NWs-GTE CV showed a weak current response observed at 0.55 V with the addition of glucose; however, no current was observed without the glucose addition. The authors attribute the phenomenon to oxidation of glucose starting at a potential of +0.4 V and the current continued to increase with an increase in the potential to 0.55 V, which demonstrated that Cu NWs contributed an important role in the electrochemical oxidation of the glucose (Fan et al. 2013). Amperometric studies were conducted for GTE, Cu NWs, and modified Cu NWs-GTE with the addition of glucose every 60 s at potential of +0.55 V. The results for Cu NWs and GTE showed no obvious current response with the addition of glucose (Fan et al. 2013). Moreover, Cu NWs-GTE showed a step-like increase with every addition of glucose solution. The authors attributed the electrochemical enhancement of the Cu NWs-GTE to the direct electron transfer between Cu NWs and GTE. The group was able to achieve detection limit of 1.6 µM and a sensitivity of 1100 µA/mM cm$^2$.

Yuan et al. (2013) conducted a study on the development of a graphene oxide-nickel oxide modified GCE non-enzymatic glucose sensor. The objective of this study was to fabricate, characterize, and analyze a graphene oxide (GO) nickel oxide nanoparticles (NiO NPs) modified GCE for detection of glucose. In comparison with the bare GCE, the GO-GCE surface showed a wrinkled structure, which was attributed by the authors to the GO on the surface of the GCE. Similarly, compared with the bare GCE, the NiO NPs-GCE had layers of NiO NPs deposited on the GCE surface that were aggregated with spherical-like nanostructures. The NiO-GC-GCE SEM micrographs were similar to the NiO NPs-GCE micrographs with aggregated NiONPs covering the GO-GCE surface. The group conducted selectivity studies using ascorbic acid, uric acid, and sodium chloride, known to make metal and alloy electrodes inactive for the enzyme free detection of glucose (Yuan et al. 2013). The amperometric results showed that the interferents and sodium chloride showed significant interference with the detection of glucose. The group achieved a sensitivity of 1087 µA/mM cm$^2$ with a detection limit of 1 µM.

Alizadeh and Mirzagholipur (2014) investigated a Nafion-free non-enzymatic amperometric glucose biosensor based on copper oxide nanoparticles-graphene nanocomposites. The objectives of this study were to fabricate a copper oxide nanoparticles-graphene nanocomposite. The XRD results of the copper oxide nanoparticles pattern was an identical match with pure copper oxide, which the authors attributed to the high purity single-phase copper oxide with monoclinic structure. Based on the Sherrer formula, the group calculated the size of the nanoparticles as 13.1 nm. The fabricated glucose biosensor achieved a detection limit of 0.09 µM.

Li et al. (2014) investigated novel ultrasensitive non-enzymatic glucose sensors based on controlled flower-like copper oxide hierarchical films. The objective of this study was to fabricate tailored flower-like copper oxide film electrodes for the detection of glucose. Sensitivity levels of the chrysanthemum-like, candock-like, and dandelion-like were found to be 3252 µA/mM cm$^2$, 4078 µA/mM cm$^2$ and 5368 µA/mM cm$^2$, respectively.

Shervedani et al. (2014) investigated prickly nickel nanowires grown on a copper substrate as an ultrasensitive enzyme-free electrochemical glucose sensor. The objective of this study was to fabricate three-dimensional prickly nickel nanowires (PNNWs) for the detection of glucose without the use of an enzyme. The group used a three electrode system, which included a Ag/AgCl (3 M KCl) electrode as the reference electrode, a large area platinum plate as the counter electrode (~70 times larger than the working electrode), and the copper nickel electrode (control) and the copper PNNWs as the working electrode.

Zhang et al. (2014) developed CuO nanowires-based sensitive and selective sensors for non-enzymatic glucose detection. The objective of this study was to fabricate a copper oxide nanowire modified GCE for the detection of glucose. The modified copper oxide GCE was able to achieve a response time of less than five seconds. The glucose detection limits of the modified copper oxide GCE at a potential of 0.55 V and 0.3 V were 648.2 µA/cm$^2$mM and 119 µA/cm2 mM, respectively.

Ismail et al. (2014) investigated the development of a non-enzymatic electrochemical glucose sensor based on a graphene oxide nanoribbon gold nanoparticle hybrid. The objective of this study was to fabricate gold nanoparticles (Au NPs) graphene oxide nanoribbons (GO NR) on a carbon sheet substrate for direct glucose oxidation reaction under neutral conditions (Ismail et al. 2014). This type of glucose sensor was developed for continuous glucose monitoring. The MWCNTs spectrum did not show any hydroxyl peak or carbonyl bands, which the authors attributed to the MWCNTs having undergone oxidation unzipping to create a GO NR material electrode (Ismail et al. 2014). The Au NP/GO NR hybrid electrode detection range was 0.5 µm to 10 mM.

Tarlani et al. (2014) investigated zinc oxide nanostructures as non-enzymatic glucose biosensors. The objectives of this study were to develop, characterize, and analyze a zinc oxide (ZnO) nanostructure multi-walled carbon nanotube (MWCNT) modified GCE used as an enzyme free glucose biosensor.

The authors were able to achieve a sample detection time of 60 s. Additionally, the group was able to achieve a sensitivity of 64.29 µA/mMcm$^2$ with a detection limit of 0.82 mM.

Zhao et al. (2014) studied high-power, non-enzymatic glucose biofuel cells based on three-dimensional platinum nanoclusters immobilized on MWCNTs. The objective of this study was to fabricate, characterize, and analyze an implantable glucose biofuel cell developed from a MWCNTs electrode with 3D platinum nanoclusters immobilized on the surface of the nanotubes. The group was able to demonstrate a high power density of 2.3 mM/cm², an open circuit potential of 0.70 V and great stability.

Kani et al. (2014) conducted a study on a non-enzymatic glucose sensor based on nickel hydroxide nanoparticles. The objective of this study was to fabricate, characterize, and analyze the nickel hydroxide nanoparticles modified graphite electrode for enzyme free detection of glucose. The characterization techniques used were XRD, field emission scanning electron microscopy (FESEM), CV, and amperometry. CV was performed with and without the addition of glucose solution (8 mM concentration after addition to the working electrode). The results for bare graphite showed no anodic or cathodic peaks with and without the addition of glucose, which the authors attributed to a very weak oxidation of glucose with this electrode. However, the CV results of modified graphite showed an anodic peak at 540 mV and cathodic peak at 330 mV without the addition of glucose. The authors attribute this to the chemical transformation of nickel (II)/nickel (III); additionally, the addition of the glucose solution resulted in an increase in the intensity of the oxidation peak but a decrease in the reduction peak, which indicated that the nickel hydroxide nanoparticles could electrocatalyze the oxidation of glucose (Kani et al., 2014). The system achieved a detection limit of 0.53 µM and sensitivity of 2400 µA/mM cm².

Dhara et al. (2014) conducted a study on platinum copper oxide nanoparticles decorated reduced graphene oxide for fabrication of a highly sensitive non-enzymatic disposable glucose sensor. The objectives of this investigation were to fabricate, characterize, and analyze the platinum nanocubes (Pt NC) and copper oxide nanoflowers (CuO NF) deposited on the reduced graphene oxide (rGO) for glucose detection. LSV data were collected for SPE, activated SPE, Pt/GO/SPE, CuO/rGO/SPE, and Pt—CuO/rGO/SPE in 0.1 M NaOH with the addition of 3 mM glucose solution. The results showed that the SPE, activated SPE, and Pt/GO/SPE showed no anodic peak with the addition of glucose solution (Dhara et al. 2014). However, the CuO/rGO/SPE and Pt—CuO/rGO/SPE showed a well-defined anodic peak at +0.35 V. EIS studies were conducted with bare SPE, activated SPE, Pt/rGO/SPE, CuO/rGO/SPE, CuO/rGO/SPE, and Pt—CuO/rGO/SPE in 0.1 M NaOH solution. The results showed the CuO/rGO/SPE had a higher charge transfer resistance (114Ω) in comparison with Pt—CuO/rGO/SPE (71Ω). Amperometric studies showed that at a potential of 0.6 V with the addition of glucose solution, in less than 3 s, a stable result was achieved (Dhara et al. 2014). The group was able to achieve a sensitivity of 3577 µA/mM cm² with a signal to noise ratio of 3 and detection limit of 0.01 µM. The group conducted selectivity studies with known interfering reagents (ascorbic acid, dopamine, and uric acid). The results showed no current response with the addition of the interfering reagents until the addition of the glucose solution.

Thus far, working electrodes, although nanotechnology-based, were not pure carbon. Both carbon nanofibers and carbon nanotubes have been investigated as potential testing platforms for electrochemical detection.

Koehne et al. (2004) studied the fabrication and electrochemical characterization of nanoelectrode arrays (NEAs). Subsequently, these materials were re-classified as carbon nanofibers, which have a different structure than carbon nanofibers (CNFs). However, for the purpose of this review, the language of the original publication will be retained. The objective of this study was to develop a novel fabrication method and to characterize the electrochemical properties of MWCNT NEAs. The MWCNT NEAs were fabricated using a bottom-up approach through plasma enhanced chemical vapor deposition (PECVD) on a silicon substrate.

Carbon Nanotechnology-Based Electrodes for Glucose Detection

Wang et al. (2003) studied a novel MWCNT-based biosensor for glucose detection. The objective of the study was to fabricate a MWCNT-based glucose biosensor and to conduct a comparison study of the MWCNTs electrode with a glassy carbon (GC) electrode. The MWCNTs were synthesized using microwave plasma enhanced chemical vapor deposition. A nickel catalyst was deposited on a silicon wafer and the MWCNTs were grown at a deposition pressure of 9.33 kPa, a substrate temperature of 850° C., microwave power of 1 kW, and a feeder gas flow ratio of $CH_4/(CH4+H_2)$ of 10% (Wang et al. 2003). The dimensions of the fabricated MWCNTs were 25 µm long with an average diameter of 30 nm. Glucose oxidase was immobilized using the following process: 1) a thin film of gold was evaporated on top of the surface of MWCNTs, 2) the silicon substrate was etched away using a 1:3 ratio of nitric acid and hydrofluoric acid, 3) after the removal of the silicon substrate, the MWCNTs remained on the gold substrate, and 4) the MWCNTs were submerged in 10 mM PBS solution that contains glucose oxidase (Wang et al. 2003). The MWCNTs were characterized using SEM, TEM, and FT-IR. Amperometric studies were performed using a three electrode arrangement with GC or MWCNTs as the working electrode, an Ag/AgCl reference electrode, and a platinum wire counter electrode.

The amperometric studies were conducted at +0.65 V and +0.45 V. The results showed a current response with the addition of a 2 mM glucose solution for both GC and MWCNTs electrodes at 0.65 V; however, at 0.45 V only MWCNTs had a current response. The group also found that the MWCNTs were more stable than the GC. The authors attributed this to the carboxylic acid groups formed on the edges of the MWCNTs, which added a benefit of allowing additional glucose oxidase to be immobilized.

Lin et al. (2004) investigated glucose biosensors based on carbon nanotube nanoelectrode ensembles. The objectives of this study were to develop a carbon nanotube glucose biosensor, conduct electrochemical characterization, and demonstrate the selectivity of this biosensor. The CNTs were fabricated using PECVD. CV and amperometric electrochemical techniques were employed. The authors used a three electrode system with saturated calomel as the reference electrode, the CNT array as the working electrode, and platinum wire as the counter electrode.

Pham et al. (2010) conducted an electrochemical characterization of a single-walled carbon nanotube (SWCNT) electrode for the detection of glucose. The objectives of this study were to develop a Nafion/GOx/SWCNT film and to conduct electrochemical characterization of the Nafion/GOx/SWCNT film electrodes for the detection of glucose. The SWCNT films were fabricated using a vacuum filtration technique. The electrochemical characterization was performed using a CHI600C electrochemical analyzer. The group used a three electrode setup with Ag/AgCl (saturated in 3 M NaCl) as the reference electrode, platinum wire as the counter electrode and the SWCNT films and Nafion/GOx/SWCNT films as the working electrode.

Significant research has been conducted in the area of glucose biosensors, progressing from a first generation sensor that requires natural oxygen to a second generation that uses a synthetic electron acceptor to a third generation sensor that includes a reagentless operation. However, even with advances in non-enzymatic glucose sensors that do not require glucose oxidase and are, typically, nanotechnology-based, these sensors are primarily nickel and copper materials have been used with glassy carbon often used as the underlying substrate for the working electrode, but, to the knowledge of the author, pure carbon has not been demonstrated as the actual working electrode material. Carbon nanotubes and carbon nanofibers have been used to detect various compounds including glucose with the aid of glucose oxidase. Therefore, it would also be desirable to provide a method of detecting glucose that provides non-enzymatic detection using a pure carbon working electrode with improved qualitative and sensitive capabilities. The invention meets these needs.

SUMMARY OF THE INVENTION

A non-enzymatic glucose sensor is provided comprising carbon nanofibers and an electrode.

Preferably, the carbon nanofibers are vertically aligned and range in size between 13 to 160 nm in diameter. More preferably the diameter of the nanofibers is between 60 to 70 nm. Additionally, the sensor is comprised of carbon nanofibers with a density of 40 fibers/$\mu m^2$.

The sensor of the present invention is also characterized by having a CNF electrode surface area of at least 100 $mm^2$; the electrode surface area can be tailored, however, based on the carbon nanofiber density, from a surface area of zero to 1000 $mm^2$. Further, the sensor of the present invention has a capacitance of at least 0.2 $\mu c/mV$.

The sensor of the present invention is prepared using plasma enhanced chemical vapor deposition (PECVD). More specifically, the method of preparing the sensor of the present invention comprises depositing one or more carbon nanofibers on an electrode surface. The non-enzyme glucose sensor is prepared using a silicon wafer with 500 nm thermal oxide, depositing a chrominum layer using an electron beam, depositing a nickel layer, using direct current plasma enhanced chemical vapor deposition using a feeder gas $C_2H_2$ feed stock and $NH_3$ diluent. Further, the method of preparing a sensor may include an additional step of depositing one or more transition-metals or metal oxides, wherein the transition-metal may be selected from the group consisting of nickel, copper, copper oxide, platinum and zinc.

In one embodiment of the invention, one or more CNF sensors are contacted with a sample under conditions sufficient to allow the sample to bind to the sensor, wherein detection of glucose indicates the presence of glucose in the sample. In one embodiment, the CNF sensors are comprised of nanofibers with diameters between 12 to 160 nm. In another embodiment, the nanofibers have density of 40 fibers/$\mu m^2$.

In one embodiment of the invention, one or more electrodes of the sensor are connected to a glucometer which senses the glucose level in blood. In various embodiments the non-enzymatic glucose sensors of the invention are stable at a wider range of temperature while maintaining a high degree of selectivity and sensitivity.

In one embodiment of the invention, the one or more CNF sensors are contacted with a sample. The sensor may be contacted with any fluid sample, such samples may include blood, saliva or urine.

The invention also includes a kit comprising: one or more CNF sensors and at least one table for correlating the detected glucose level.

BRIEF DESCRIPTION OF THE DRAWINGS

The patent or application contains at least one drawing executed in color. Copies of this patent or patent application publication with color drawings will be provided by the Office upon request and payment of the necessary fee.

FIG. 6A is ×10,000 magnification; FIG. 6B is ×20,000 magnification; and FIG. 6C is ×35,000 magnification.

DETAILED DESCRIPTION OF THE INVENTION

The present disclosure describes sensor/devices, methods, systems, and kits for sensing glucose levels in a fluid using glucose sensors and the fabrication of the same. Specifically, the present disclosure contemplates a highly sensitive non-enzymatic glucose sensing device and a method for fabricating the same.

In one embodiment, the glucose sensor comprises one or more carbon nanofibers and an electrode. The non-enzyme sensors of the invention avoid problems associated with use of conventional enzyme sensors, including temperature sensitivity, degradation of the enzyme leading to short shelf life, high costs, and restrictions on adaptability to field use.

In one embodiment the carbon nanofiber sensor is implantable in an intravenous device, such as an implantable needle-type device or port, suitable for real-time monitoring. Such intravenous device may include any central venous catheter, pulmonary artery catheter, venal probes, peripheral IV catheter, Swan-Ganz catheter, or any other blood management systems.

The present invention incudes a combination of providing on an insulating silicon wafer base plate/substrate a combination of materials, including a thermal oxide on the base plate, a chromium layer, a nickel layer, and a coating of carbon nanofibers. The use of this combination, and in particular the use of carbon nanofibers, allows for the electrochemical oxidization of glucose. In one embodiment, the sensor to detect the electrochemical oxidization is a potentiostat. The potentiostate may be connected to a computer using software installed from the potentiostat vendor.

Figure 1:
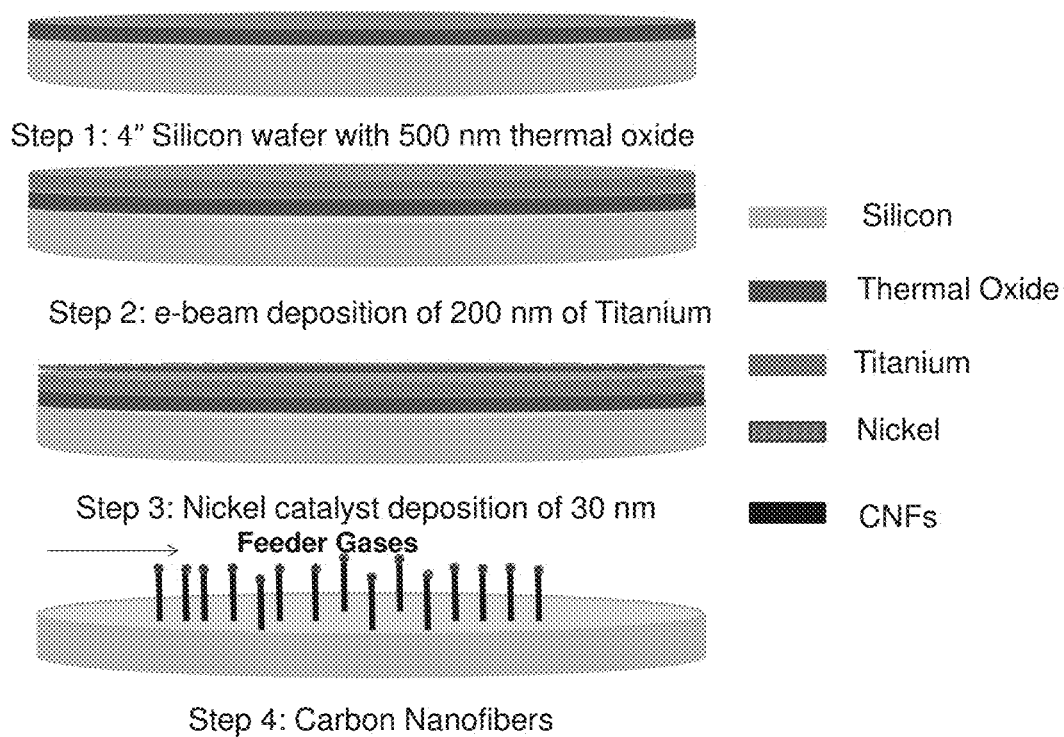
FIG. 1 illustrates the steps taken to fabricate CNFs.

A representation of the process in making one configuration of the fabrication of the non-enzyme glucose sensor of the invention is shown in FIG. 1. The active material is provided and deposited on an electrode surface or base plate, particularly carbon nanofibers. In this process, the depositing is the carbon nanofibers on one or more transition-metal or metal oxide materials. The transition metal may be titanium and $SiO_2$ is the metal oxide.

The base plate or substrate can be made of a variety of materials, such as plastics, ceramics, polymers or silicon wafers based upon the application of the electrode. Such selection of the base plate material should take into consideration the end application of the glucose sensor device, for example if the device is implanted in a patient or utilized in an automated detection system. The base plate can be a silicon wafer with a thickness between the ranges of 100 μm to 1000 μm, between 160 μm to 500 μm, or between 200 μm to 300 μm.

Referring to FIG. 1, Methods of fabrication the CNF glucose sensor comprise providing a base plate at step 1. The base plate is fabricated of a material that can be used for high temperature processing, such as graphene. At step 1, one or more layers of thermal oxide is applied to the base plate, with an average thickness of ~500 nm. The layer of thermal oxide can be applied between 100 nm-1000 nm thick. The resulting oxide-covered silicon wafer is used as the base or substrate (platform) for the growth of CNFs. At step [300], the titanium layer is deposited over the oxide-covered base using an electron beam (e-beam) deposition. At step 2, a chromium layer is deposited over the oxide-covered base. Other techniques for the deposition of the titanium layer, including printing methods or drop casting may be utilized. The layer of titanium can be between 50 nm-500 nm and more preferably is about 200 nm. The chromium layer is approximately 200 nm thick. At step 3, a layer of nickel is deposited on the silicon base. The nickel layer is applied in a range between 20-60 nm. Preferably, the nickel layer is approximately 30 nm thick. The nickel layer is deposited on the substrate using printing techniques know in the art. For example, the nickel layer is applied using e-beam or UV lithography. The nickel layer can be applied in a pattern of dots that could range in size from 100 nm to over 1 μm. At step 4, a layer of copper or zinc is deposited on the silicon base. At step 4, using direct current plasma enhanced chemical vapor deposition (PECVD), a CNFs forest array is grown from the nickel catalyst. The CNFs array is created using a feeder gas $C_2H_2$ feedstock and $NH_3$ diluent. The CNFs array may be created using a feeder gas feedstock and diluent at a pressure of ~4.0 torr and a plasma power of 410.

Method of preparing a CNFs electrode sensor may include an additional step of depositing one or more transition-metals or metal oxides, wherein the transition-metal may be selected from the group consisting of nickel, copper, copper oxide, platinum and zinc.

Figure 24:
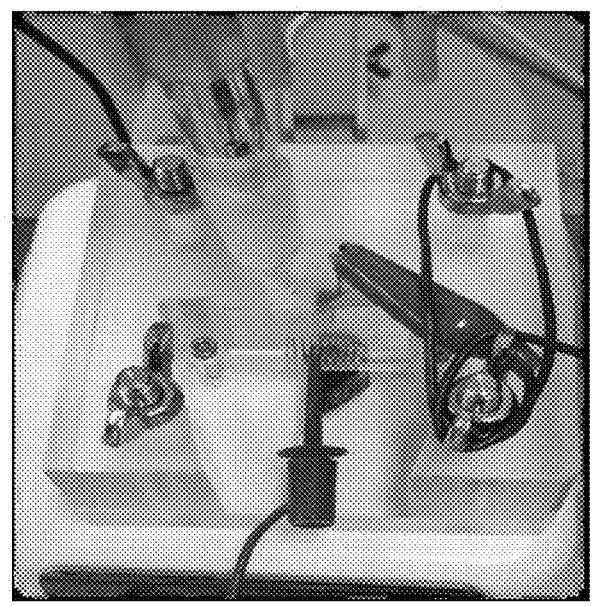
FIG. 24 provides an embodiment of the glucose sensor.

An actual configuration of the non-enzyme CNFs glucose sensor is shown in FIG. 24. This figure includes images of wires that lead to a potentiostat. The potentiostat may be connected to a computer with software installed from the potentiostat vendor; this combination serves as the data acquisition and display mechanism.

Figure 3:
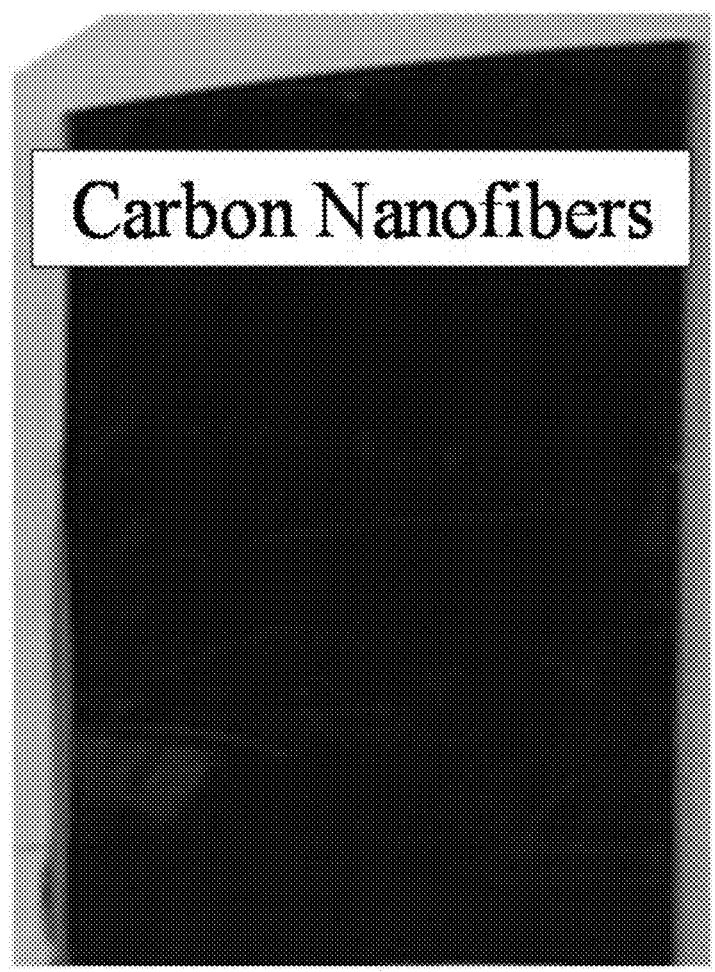
FIG. 3 illustrates a Carbon Nanofiber Electrode.
Figure 23:
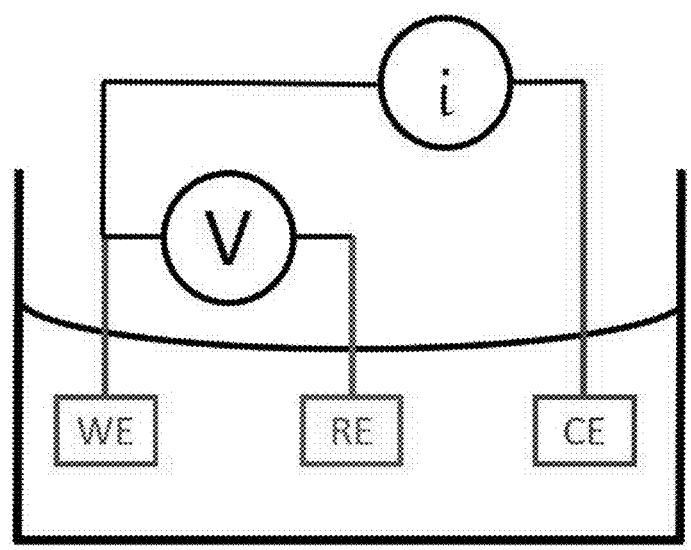
FIG. 23 provides a schematic diagram of a glucose sensor.

In FIG. 23, a schematic figure of the complete configuration of the glucose sensor is provided, such that the glucose sensor comprises at least one electrode, a working electrode (we), a reference electrode (re), a counter electrode (ce). An energy source is provided as voltage (V) and the energy current (i) is also shown. The individual sensors are then incorporated into a suitable device for testing the glucose level in a fluid. A completed CNFs electrode as prepared using the process presented above is shown in FIG. 3.

The carbon nanofibers using the process provided above, are vertically aligned and range in size between 13 to 160 nm in diameter. The carbon nanofibers may have a diameter between 60 to 70 nm. The sensor may be comprised of carbon nanofibers having a density of 40 fibers/$\mu m^2$. The carbon nanofibers may have a height of about one micron.

The non-enzyme sensor is also characterized by having a CNF electrode surface area of at least 100 $mm^2$. Further, the sensor of the present invention has a capacitance of 0.2 μc/mV. In various embodiments of the invention, it is preferable for the sensor to have a capacitance of at least 0.2 μc/mV.

Figure 5:
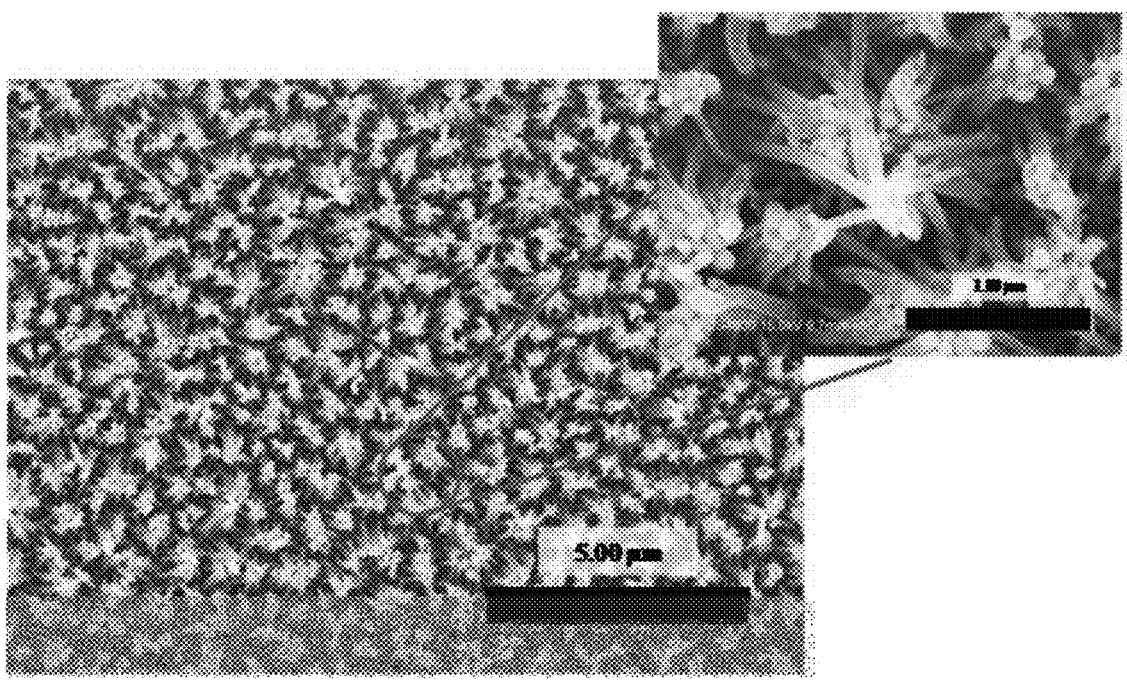
FIG. 5 provides FESEM micrographs of CNFs.

One or more CNF sensors are contacted with a sample under conditions sufficient to allow the sample to bind to the sensor, wherein detection of glucose indicated the presence of glucose in the sample. The CNF sensors are comprised of nanofibers with diameters between 12 to 160 nm as shown in FIG. 5. The nanofibers may have a density of about 40 fibers/$\mu m^2$.

One or more electrodes of the sensor are connected to a glucometer that senses the glucose level in blood. The non-enzymatic glucose sensors of the invention are stable at a wider range of temperature while maintaining a high degree of selectivity and sensitivity. The non-enzymatic CNF electrode sensors of the present invention may be tested using electrochemical techniques such as amperometry to determine a response current proportional to any analyte in a solution. The amperometric measurements using embodiments of the invention can be performed using instruments and readout electronics known in the art for such analysis.

When using CNF sensors of the invention to detect glucose in a body fluid sample from a mammal, one or more CNF sensors are contacted with an aqueous or fluid sample obtained from the mammal. The sensor may be contacted with any bodily fluid sample, including saliva, blood or urine.

The invention also includes a kit comprising: one or more CNF sensors and at least one table for correlating the detected glucose level.

EXAMPLES

The various experiments described herein illustrate the production and characterization of the CNF electrode sensor and non-enzymatic glucose device. These experiments also provide various characterization methods. Further, these experiments demonstrate the electrochemical systems and three electrode systems used in the development of the glucose device. Finally, two electrochemical techniques, cyclic voltammetry (CV) and amperometry also demonstrate the improved sensitivity of the sensors of the present invention.

Example 1: Preparation of CNF Electrode Sensor Using PECVD and Characterization of the Sensor An exemplary sensor according to the various embodiments of the invention is illustrated in FIG. 1 was prepared. Specifically, the electrode was an array of vertically aligned carbon nanofibers (CNFs) fabricated using plasma enhanced chemical vapor deposition (PECVD).

FIG. 1 shows an example of the steps used in the fabrication of the CNF electrode. As illustrated in FIG. 1, the first step is to use a 4 inch in diameter silicon wafer. The thickness of the silicon wafer can be between the ranges of 100 µm to 1000 µm, even more standard is 160 to 500 µm, typical is 200-300 µm and is covered with thermal oxide, with an average thickness of ~500 nm. The layer of thermal oxide can be applied between 100-1000 nm thick. This oxide-covered silicon wafer is used as the base or substrate (platform) for the growth of CNFs. Next, an electron beam (e-beam) deposition is used to deposit a chromium layer to the oxide-covered silicon base. The layer of chromium can be between 20-60 nm, with the preferred thickness of approximately 20 nm and most preferred thickness of approximately 30 nm. A layer of nickel used as the catalyst is then deposited on the chromium coated silicon wafer. The nickel layer is approximately 30 nm thick. This nickel film could be patterned in dots that could range from 100 nm to over 1 µm using e-beam and UV lithography, respectively (Koehne et al. 2004). Finally, a CNFs forest array is grown from the nickel catalyst using direct current plasma enhanced chemical vapor deposition (PECVD) in a custom made chamber using a feeder gas $C_2H_2$ feedstock (22.5 sccm) and $NH_3$ diluent (80 sccm) at a pressure of ~4.0 torr and a plasma power of 410 W (Arumugam et al. 2010). Scanning electron micrographs were taken for structural characterization of the CNFs.

Structural and Morphological Characterization Methodology

The CNF electrode sensors were characterized using SEM and EDS. The SEM instrument was a field emission scanning electron microscope (FESEM) (S4800, Hitachi, Pleasanton, Calif.). A field-emission cathode located in the electron gun of an SEM provides narrow probing beams at low or high electron energy, which results in enhanced spatial resolution with minimal sample charging and damage relative to standard SEMs (Field Emission Scanning Electron Microscopy 2015). In this method, the surface on the material being analyzed is bombarded with electrons, which results in a micrograph of the material at high magnetization.

EDS was another technique used with SEM. This technique identifies the elemental composition of the material being imaged by the SEM for all elements whose atomic number is greater than boron with the ability of detection at concentrations of 0.1% (Energy Dispersive Spectroscopy 2015). This method utilizes x-rays to determine the chemical composition of the material. The sample is bombarded with an electron beam from an SEM, which scans across the material surface. This results in excitation of x-rays that are emitted from the sample material. These excited x-rays are specific for each element. The energy of each x-ray photon produced corresponds and relates to a specific element (Energy Dispersive Spectroscopy 2015). The x-rays are sorted and plotted based on their energy then identified and labeled for a specific element (Energy Dispersive Spectroscopy 2015). Distribution maps of the composition of the materials are also produced based on the compositions of each element in the material. This technique was used to determine the presence of nickel in the CNFs sample.

Electrochemical Experimentation

Figure 2:
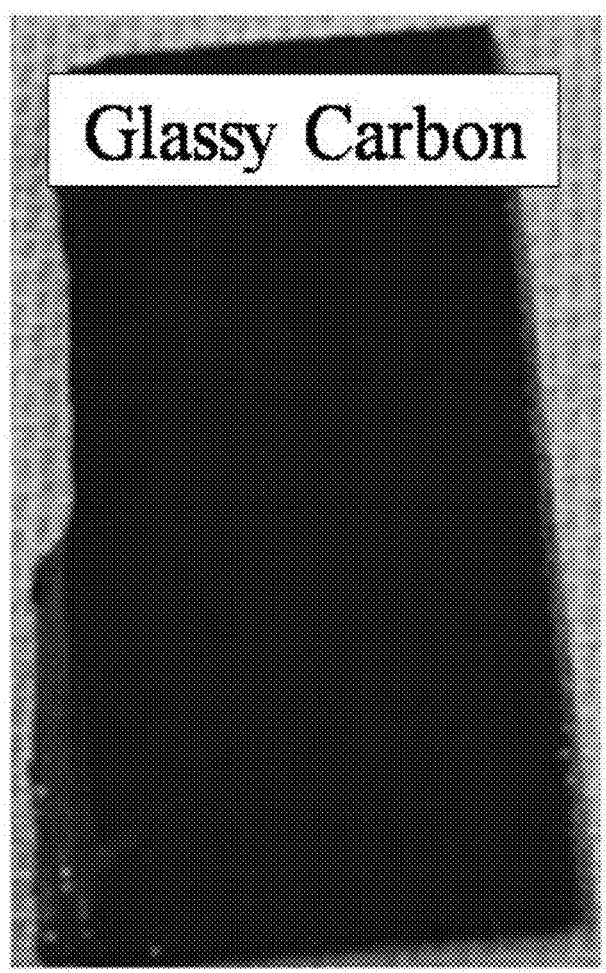
FIG. 2 provides a Glassy Carbon Electrode.

A three electrode system consisting of a working electrode, a reference electrode, and a counter electrode was used for electrochemical testing. The working electrode is the electrode that is sensitive to the analyte's concentration (Harvey 2006). FIGS. 2 and 3 show the working electrodes used for this experimentation, specifically a glassy carbon electrode (GCE) (SPI Supplies) and the CNF electrode, respectively. The reference electrode is the electrode whose potential remains constant, specifically a saturated calomel electrode was used (Princeton Applied Research) that has a potential of +0.2444 V at 25° C. (Harvey 2006). The counter electrode, an electrode that completes the electrical circuit, used in this study was a platinum wire (Sigma Aldrich).

Cyclic Voltammetry

CV was one of the electrochemical techniques used for characterization of the electrodes used in this study. The testing was a three-electrode system, which consisted of a working electrode, a reference electrode, and a counter electrode. The electrodes were connected to a potentiostat. All tests were conducted using a CH Instruments Electrochemical Analyzer potentiostat. The working electrodes were glassy carbon and CNFs. The reference electrode was a saturated calomel (mercury chloride saturated KCl). The counter electrode was platinum wire.

The reagent used for the CV characterization was either 1 mM potassium hexa-cyanoferrate (III) ($K_3[Fe(CN)_6]$) in 1 M potassium chloride or 10 mM phosphate buffered saline (PBS) solution. The testing parameters for CV were as follows: 1) potential range=−0.3 V to 0.7 V, 2) scan rate=0.1 v/s, 3) number of sweeps=6, and 4) sensitivity=$10^{-1}$-$10^{-3}$ A. The data collected using this technique was current in amperes versus potential in volts. These plots have two discreet peaks, one is referred to as the redox peak and the other is the oxidation peak. These peaks correspond to the reduction and oxidation of the reagent solutions in the forward and reverse of the reaction. The electrode capacitance was also calculated using the CV diagram.

For the CV experiment, an initial voltage of −0.3 V is applied to the working electrode. The corresponding current is recorded. The applied voltage is increased at a rate of 0.1 V until the maximum voltage of 0.7 V is reached. Then, the voltage is decreased at a rate of 0.1 V until the initial voltage of −0.3 V is reached. This process is repeated 6 times.

Amperometry

Amperometry is an electrochemical technique in which a constant potential is applied to an electrode and the current is measured. The same three-electrode system as used for CV testing was also used for the amperometry experiments.

Several experiments were conducted using amperometry. For studies conducted to determine the electrode response to repeated additions of hydrogen peroxide, the three electrode system was configured, the solvent, PBS, was added to the fluid cell; the stir plate was turned on, and 30 µL of 30 vol % hydrogen peroxide (Sigma Aldrich) was added to the cell at 90 s. The testing parameters for amperometry were as follows: 1) potential=−0.2 V, 2) run time=300 s, and 3) sensitivity=$10^{-3}$-$10^{-6}$ A. This test was designed so that the addition of the concentrated hydrogen peroxide would create 100 mM, 10 mM, or 1 mM hydrogen peroxide solutions.

In the glucose detection experiments, the following process was used: 2940 µL of 10 mM PBS was micropipetted into the fluid liquid cell that was placed on a stir plate with a stir bar for continuous mixing, the reference electrode tip was placed in the 10 mM PBS solution and the counter electrode was placed in the solution. The duration of the test was 900 s and every 180 s a 60 µL aliquot glucose was added to the fluid cell. The glucose solutions were prepared using 10 mM PBS and the concentrations used were 0.1 M, 0.25 M, 0.5 M, and 1 M.

In the selectivity studies, the initials steps were the same as for the glucose detection studies. After the counter electrode was placed in solution, the duration of the test was 900 s. During the experiment, 60 µL of uric acid, ascorbic acid, dopamine and glucose were added at 180 s, 360 s, 540 s and 720 s, respectively.

Electrode Characterization Experimentation

Both the carbon nanofiber electrodes and the glass carbon were tested to determine the physical appearance of the electrodes using scanning electron microscopy and to conduct electrochemical techniques such as cyclic voltammetry and amperometry to determine electrochemical properties of these electrodes using the following methodologies.

Morphological Characterization

Figure 4:
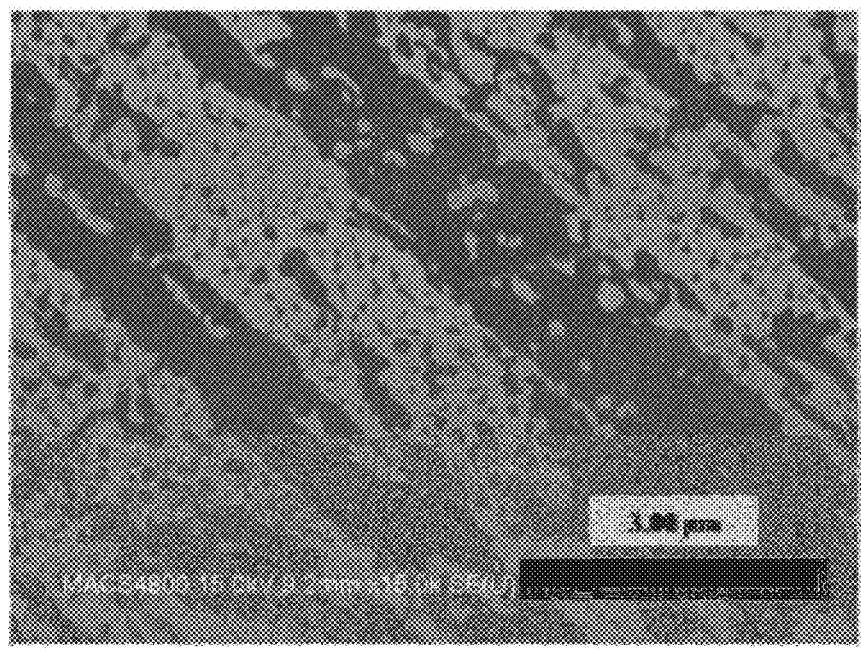
FIG. 4 provides a FESEM micrograph of glassy carbon.
Figure 6:
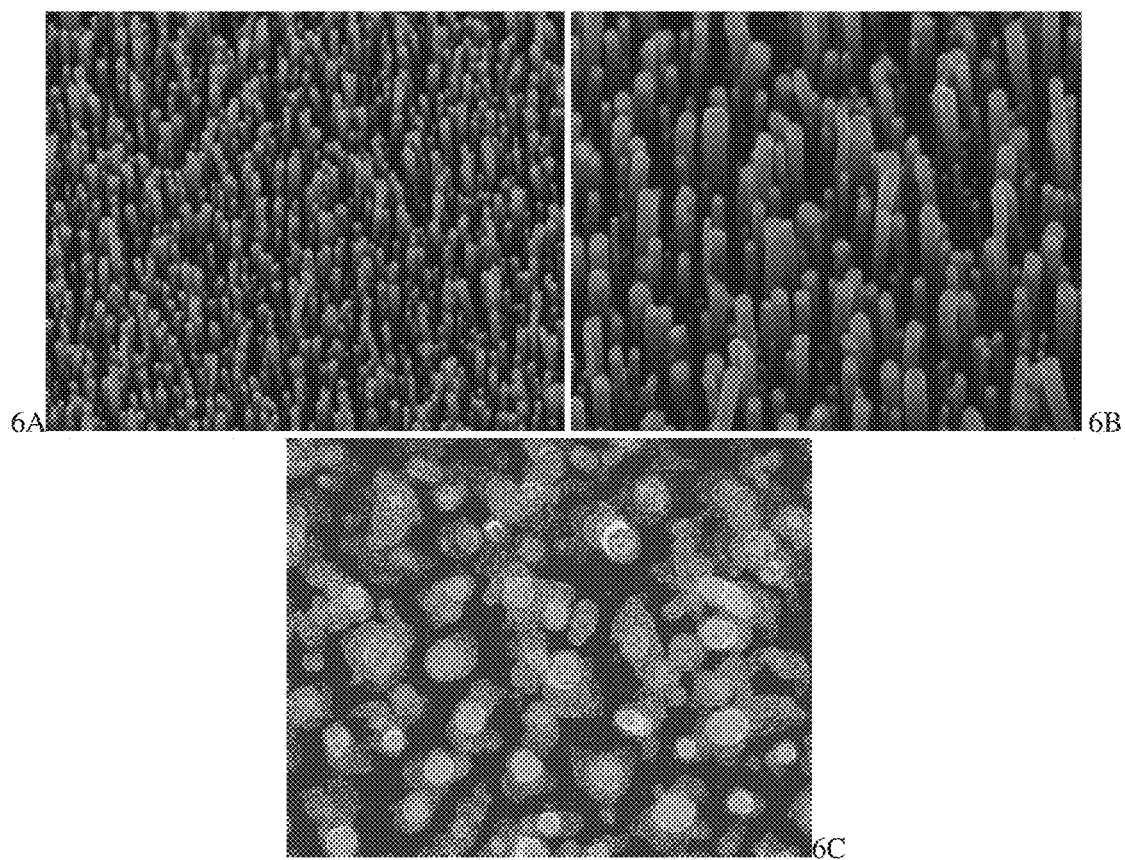
FIG. 6 provides FESEM Micrographs of CNFs with increasing magnification.

Scanning Electron Microscopy (SEM) was conducted using a field emission scanning electron microscope (FE-SEM) (S4800, Hitachi, Pleasanton, Calif.). GC, which is known as vitreous carbon or glass-like carbon, was selected as one of the electrodes because of its properties, which include low electrical resistance, a broad range of potentials, and good biocompatibility (Lewis et al. 1963). This material is non-graphitizing carbon with amorphous structure and has properties similar to ceramic/glass and graphite (Cowlard and Lewis 1967). FIG. 4 shows the FESEM micrographs for the GC electrode, which shows a flat two dimensional structure. FIGS. 5 and 6 show FESEM micrographs of carbon nanofibers. In FIG. 5, the inset picture shows a high magnification (×50,000) FESEM micrograph of the CNFs after a CV test. It was observed that the nanofibers coalesce after removal of fluid. This observation was consistent with the literature on CNFs (Nguyen-Vu et al. 2006). FIG. 6(a) is a lower magnification (×10,000) of the CNFs. The micrograph shows an array of vertically aligned fibers with varying diameters and slightly variable heights. FIG. 6(b) utilizes a magnification of (×20,000) and shows approximately 40 fibers/µm$^2$, while FIG. 6(c), an even higher magnification image (×35,000), allows the average fiber diameter to be determined using image analysis revealing a diameter range of 13-160 nm and an average diameter of ~66 nm and height of one micron.

Electrochemical Activity

Cyclic voltammetry (CV) studies were conducted using the experimental setup previously above. The reagents used in this study were 1 mM ferrocenemethanol in 10 mM phosphate buffered saline (PBS), 2 mM potassium ferricyanide (III) ($K_3[Fe(CN)_6]$) in 1 M potassium chloride (KCl), and 2 mM potassium hexacyanoferrate (II) trihydrate ($K_4[Fe(CN)_6]$) in 1 M KCl. The input settings for the program were the following: 1) initial potential=−0.3V, 2) high potential=0.7 V, 3) low potential=−0.3 V, 4) scan rate=0.1 v/s, 5) number sweeps=6, and 7) sensitivity=$10^{-1}$ or $10^{-6}$ A. FIGS. 23 and 24 show the CV graphs for the GCE and the CNF electrode, respectively. The current for the CNF electrode is significantly higher than that for the GCE for the same voltage parameters and suggests that the capacitance for the CNFs is much higher. Two discreet peaks are observed that corresponded to redox and oxidation peaks of a redox/oxidation reaction that occurs during the test. From this data, the peak separation (ΔEp) is calculated using the following equation:

$$\Delta E_p = E_{reduction} - E_{oxidation}$$

Figure 7:
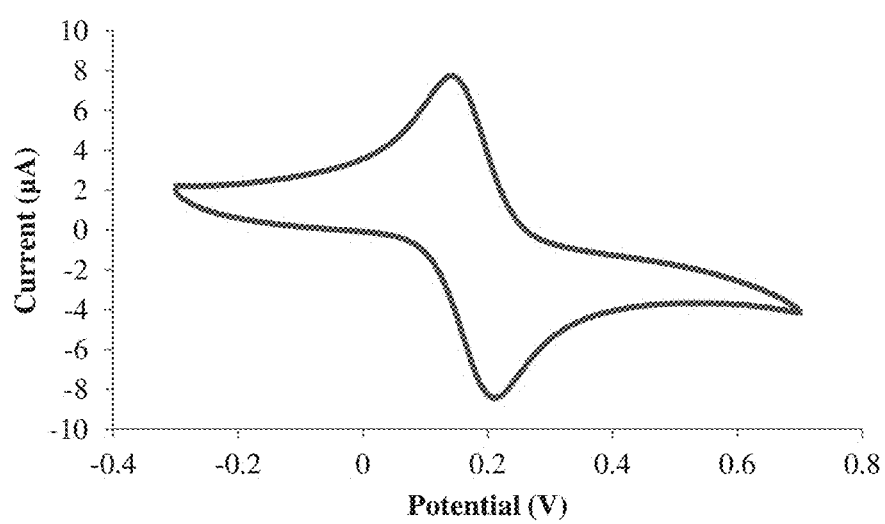
FIG. 7 illustrates a CV Plot for glassy carbon electrode.
Figure 8:
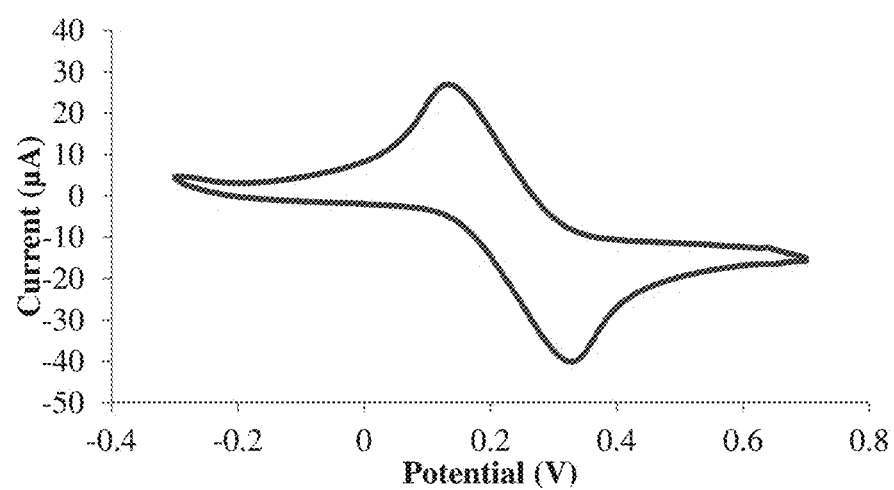
FIG. 8 illustrates a CV Plot for CNF electrode.
Figure 9:
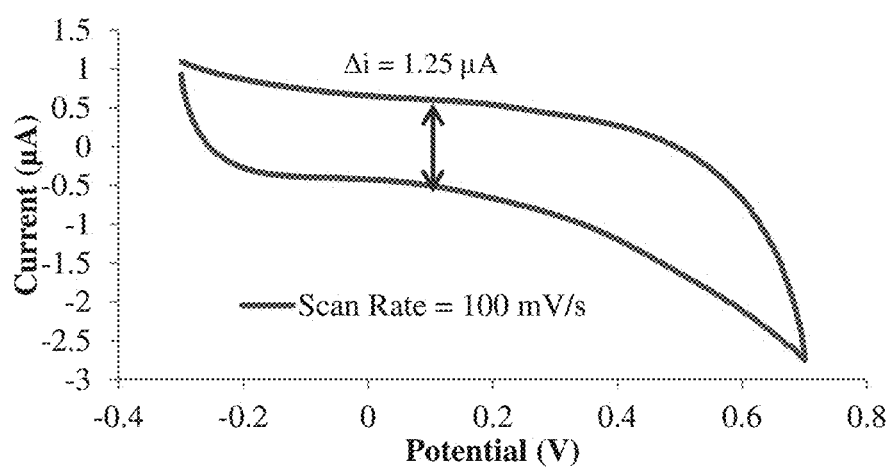
FIG. 9 illustrates a CV Data for GC electrode with no redox couple.
Figure 10:
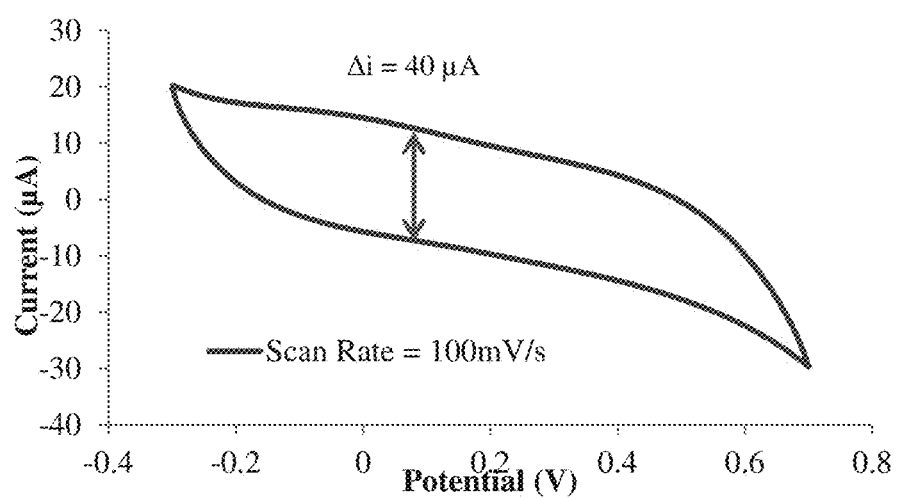
FIG. 10 provides CV Data for CNFs electrode with no redox couple.

$\Delta E_p$ is peak separation. Ereduction is the reduction peak. Eoxidation is the oxidation peak. For an ideal reversible reaction, $\Delta E_p$ is approximately 59 mv/n at 25° C., where n is the number of electrons being transferred (Mabbot 1983). FIG. 7 provides the $\Delta E_p$ for glassy carbon electrode and the CNF electrode were 69 mV and 194 mV, respectively.

Capacitance Characterization

Capacitance is a measure of the ability to store a charge and is a property that has several implications as it relates to electrodes for solution electrochemistry. First, the capacitance has a negative effect on the response time of an electrode such that a higher capacitance corresponds to a longer response time for double layer charging. This characteristic, for the CNFs, is offset by the size of the electrodes because the response time scales inversely with size. For CV experiments, a higher capacitance corresponds to a higher current signal according to the following equation that is applicable when there is no redox couple present to transfer electrons between the solution and the electrode (Nguyen-Vu et al. 2006): $C_o = \Delta i / 2v$ where $C_o$ is the specific capacitance, $\Delta i$ is the difference in current between positive and negative potential cycles, v is the scan rate.

Figure 15:
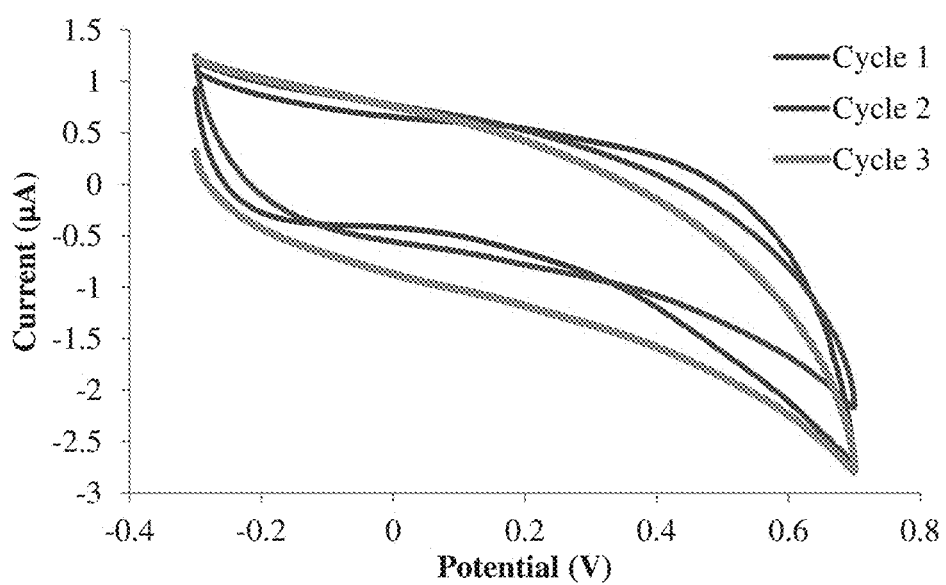
FIG. 15 provides cyclic voltammograms for the GC electrode.
Figure 16:
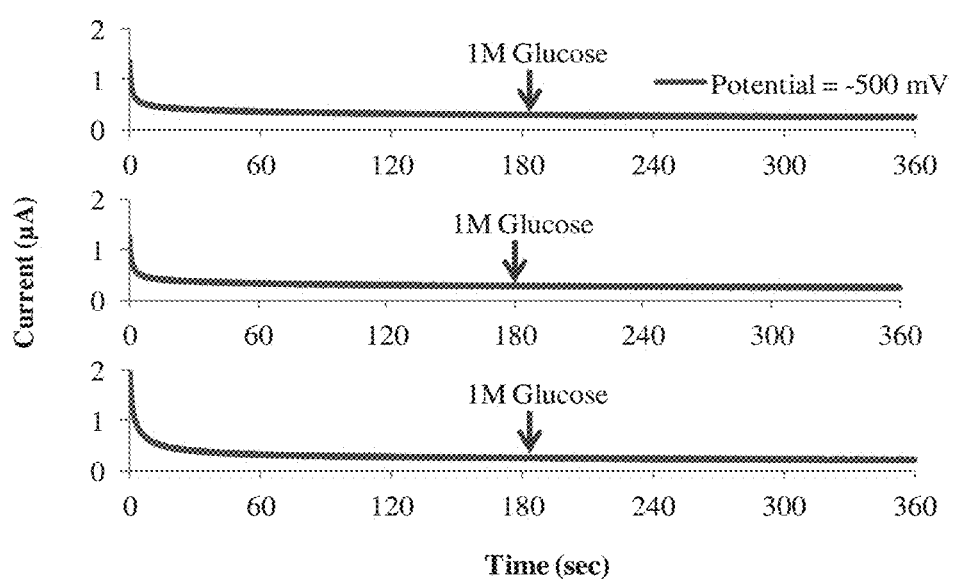
FIG. 16 illustrates the results of an amperometric study of GC current response to glucose additions.

CV experiments were conducted using 10 mM PBS solution to determine the capacitance of both the CNF and GC electrodes at a scan rate of 100 mV/s. FIG. 15 provides CV data for the GC electrode, which has a calculated capacitance of ~0.00625 µC/mV. FIG. 16 provides CV data for the CNF array, which has a calculated capacitance of ~0.2 µC/mV. The results clearly demonstrate that the capacitance is a factor of 30 greater for the CNF electrodes in comparison to GC electrodes.

Surface Area Determination

As previously mentioned the GC electrode was imaged using SEM and appeared as a flat structure. However, the CNF array was observed to have a three-dimensional structure, which consists of an array of nanofibers on the electrode surface. One important property of the working electrodes is the surface area. Several methods can be used to determine the surface area of a working electrode, including drop weight (or volume), capacitance ratio, Parson-Zobel plot, hydrogen adsorption from solution, oxygen adsorption from solution, underpotential deposition of metals, voltammetry, negative adsorption, ion-exchange capacity, adsorption of probe molecules from solution, mass transfer, adsorption of probe from gas phase, x-ray diffraction, porosity, and microscopy. With great improvements made in microscopy, however, SEM is a good option to determine the surface area. SEM was particularly applicable in the determination of the surface area because the CNF electrodes are vertically aligned and the tops are circular in nature.

Because of the advances in electron microscopy and the vertical alignment of the CNFs, SEM was used to determine the area of the CNF electrode. The area was calculated based on the area exposed by a 4 mm o-ring. The surface area of the CNFs was approximated by assuming a fiber height of 1 µm. Image analysis was then conducted to evaluate the total perimeter represented by the circumference of the CNFs over a measured area. The total perimeter was multiplied by the fiber length to determine the total surface area of the fibers over the corresponding flat area analyzed in the SEM. Finally, the area was scaled to approximate the total electrode area provided by the CNFs, which was approximately 100 mm$^2$. This represents an approximate order of magnitude increase over the area for the glassy carbon, which was approximately 10 mm$^2$.

Electrode Response to Hydrogen Peroxide

Amperometric studies were conducted using the previously discussed experimental setup discussed in Example 1. The reagents used in this study were 10 mM PBS solution and 30 vol % hydrogen peroxide. The input settings for the program were the following: potential=−0.2 V, run time=300 s, and sensitivity=10⁻³ A.

Figure 11:
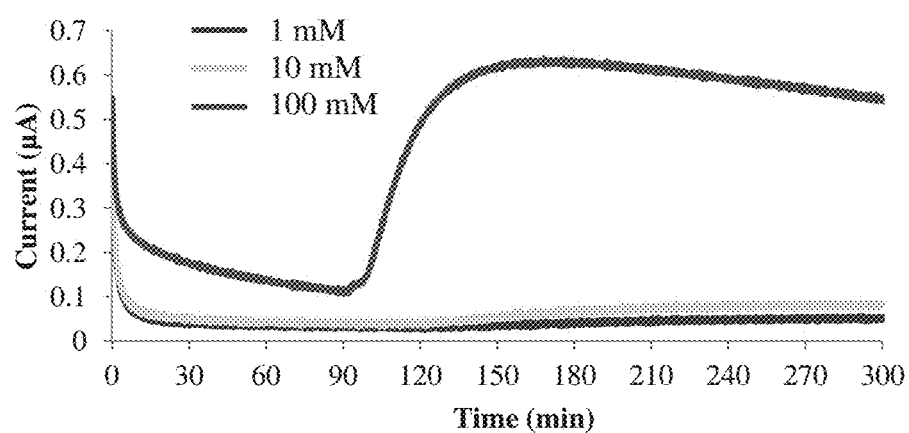
FIG. 11 provides an amperometric study of $_{H2O2}$ for glassy carbon.

For the hydrogen peroxide studies, an aliquot of hydrogen peroxide was added at 90 s and run for 5 min. FIG. 11 illustrates the one step study comparing 1 mM, 10 mM, and 100 mM concentrations for the glassy carbon. FIG. 28 demonstrates the one step study comparing 1 mM, 10 mM, and 100 mM concentrations for the CNFs. The results for both electrodes show a current response to the addition of hydrogen peroxide, which is in agreement with the following reaction:

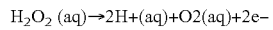

$H_2O_2$ (aq)→2H+(aq)+O2(aq)+2e−

In this reaction, hydrogen peroxide is oxidized giving up two electrons. This was observed by an increase in the current in the amperometric data for both electrodes. In spite of having a higher capacitance, however, the response time of the CNFs is much faster. Its response is an instant current response that was observed after the addition of the peroxide. This improved response is due to the nanoscale size of the carbon nanofibers. In contrast, the GC electrode did not respond until after 10 s.

Figure 12:
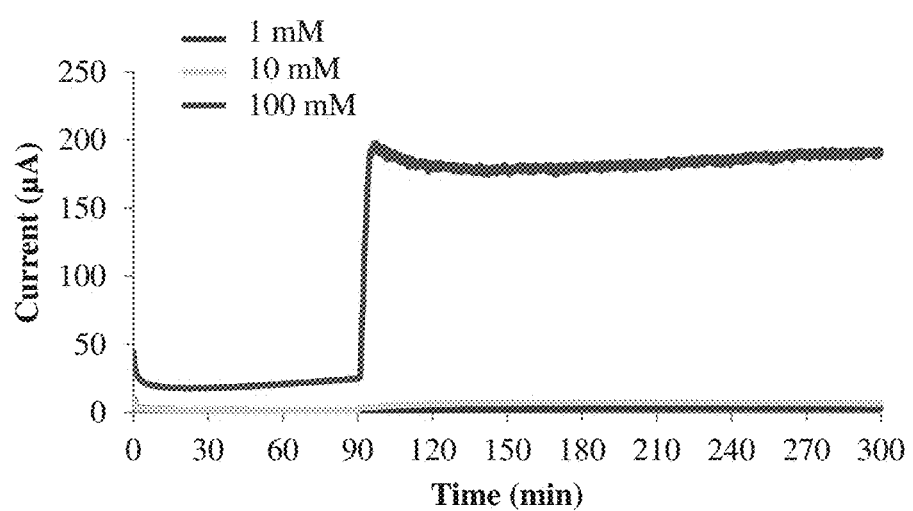
FIG. 12 provides an amperometric study of $_{H2O2}$ for CNFs.
Figure 13:
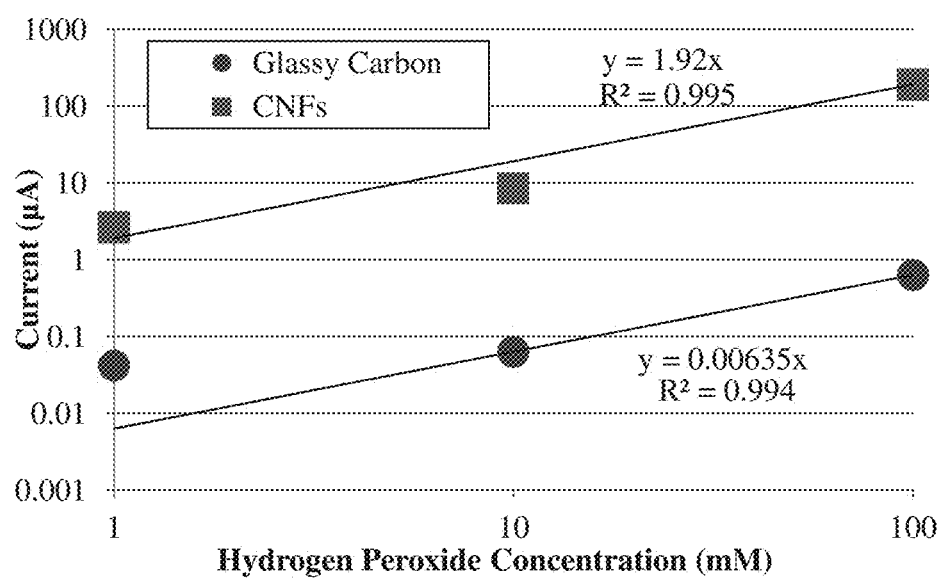
FIG. 13 provides a comparison of CNFs and GC for additions of hydrogen peroxide.

FIGS. 11 and 12 demonstrate that the more concentrated the hydrogen peroxide solution being added to the cell the larger the current response. FIG. 13 shows the electrode comparisons between CNFs and GC electrodes for the additions of hydrogen peroxide at 90 s. The results clearly show that the CNF responses to hydrogen peroxide were much larger than those of the GC, corresponding to sensitivities of 1900 µA/M and 6.3 µA/M, respectively. Moreover, with the exception of ΔEp, all aspects of the characterization, including the capacitance, surface area and hydrogen peroxide response, indicate the CNF electrode has improved performance over the more traditional GCE for solution phase electrochemical detection of glucose.

Example 2: Non-Enzymatic Detection of Glucose

Carbon nanofiber electrodes and glass carbon electrode were tested in a series of experiments to compare the selectivity of both electrodes and to demonstrate the non-enzymatic detection of glucose using carbon nanofibers.
Experimental Methodology:

An amperometric electrochemical technique was used for glucose detection. Also, before every experiment, a CV was run to ensure a proper electrical connection of the three electrode system discussed above.

The following is a brief description of the experimental procedure:

First, 2,940 µL of 10 mM phosphate buffered saline (PBS) was micropipetted into the liquid cell (as provided above) and stirred continuously; the calomel (mercury chloride saturated potassium chloride) reference electrode tip was placed in the 10 mM PBS solution. Second, a platinum wire, used as the counter electrode, was placed in the solution. A voltage was applied to the working electrode to begin the experiment.

Figure 14:
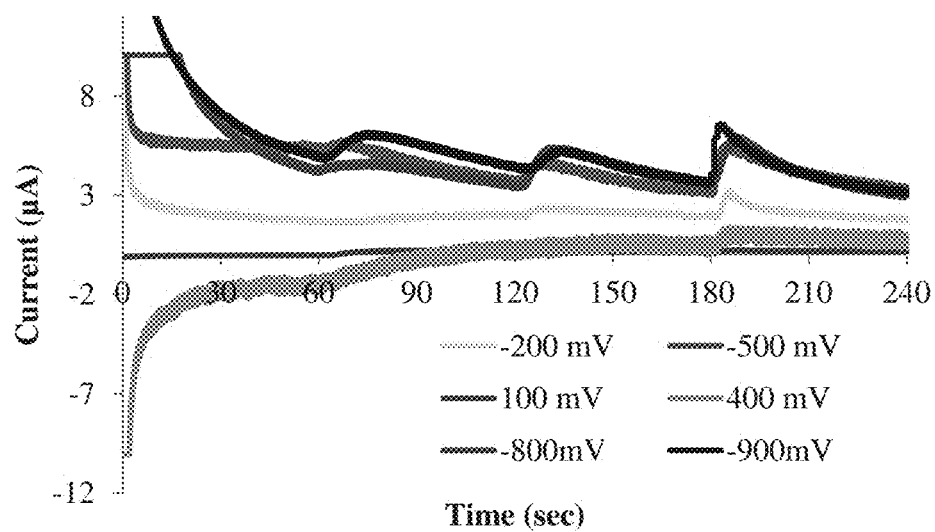
FIG. 14 illustrates the optimization of the applied voltage (electrode potential).
Figure 17:
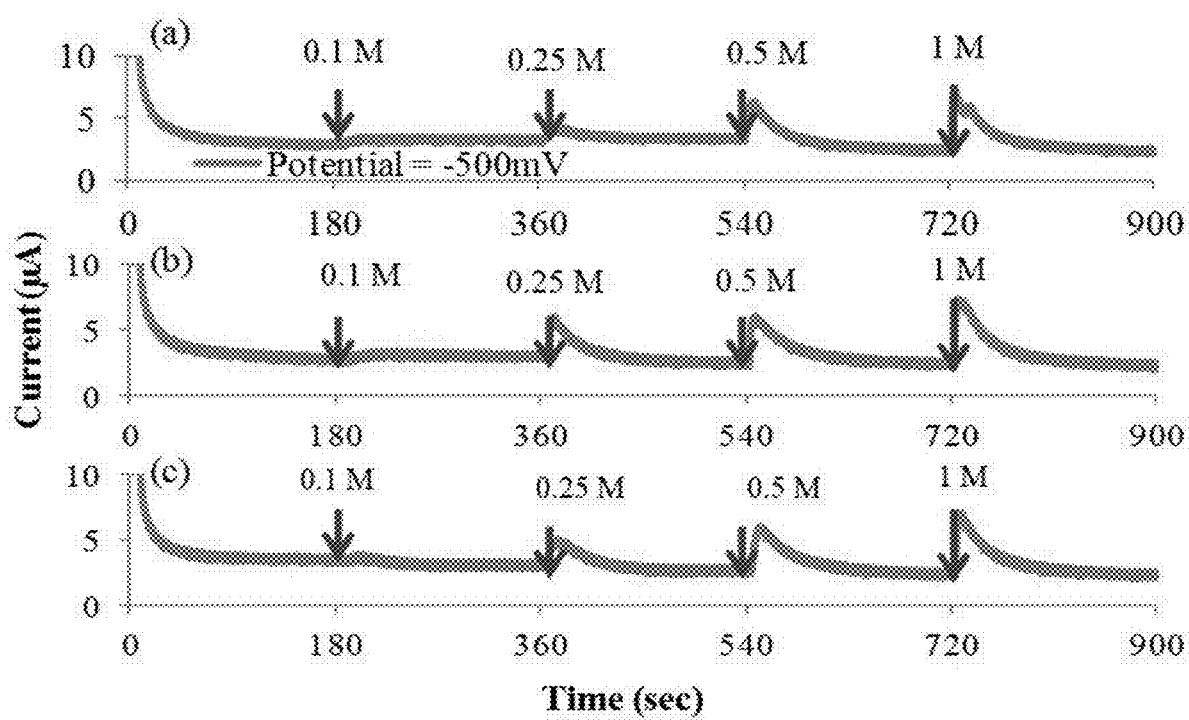
FIG. 17 provides the results of a amperometric study of CNFs current response to glucose additions.
Figure 18:
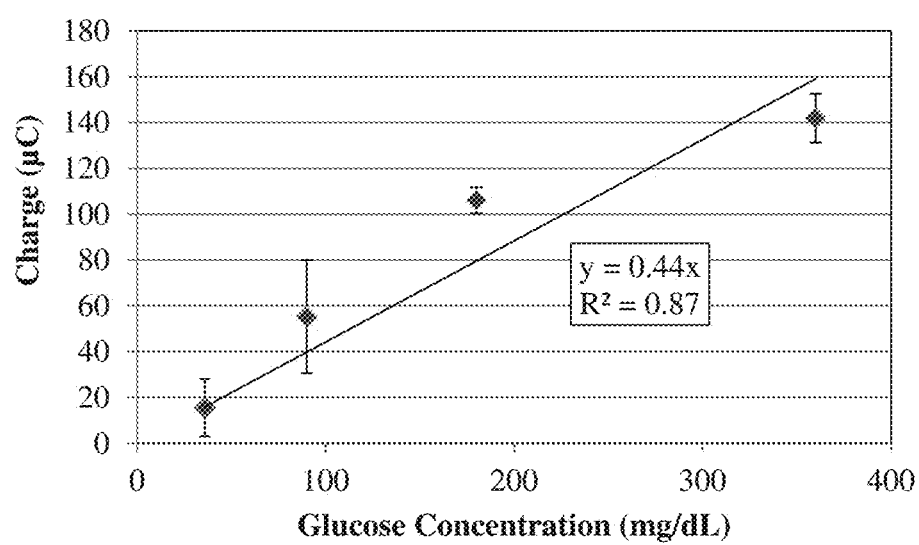
FIG. 18 provides detector signals (or charge) versus the glucose concentrations.

The duration of the experiment was 900 s and every 180 s a 60 µL aliquot of glucose was added to the fluid cell. The glucose solutions were prepared using 10 mM PBS and 0.1 M, 0.25 M, 0.5 M, and 1 M glucose concentrations.
Determination of the Applied Voltage The applied voltage was optimized for the amperometric studies. The following voltages evaluated: −900 mV, −800 mV, −500 mV, −200 mV, 100 mV and 400 mV. As shown in FIG. 14, at approximately −500 mV, the signal strength plateaus and does not increase significantly even though the absolute magnitude of the potential increases to −900 mV. Consequently, −500 mV was chosen for the study to maximize the signal while not choosing a higher absolute magnitude of potential that does not provide any GC electrodes served as a benchmark carbon material for the investigation of CNFs. FIG. 15 shows three cycles of CV data for the GC electrode with a capacitance of ~0.00625 µC/mV. These results establish that the CNF electrode is stable over multiple cycles and a good electrical connection is achieved. FIG. 16 shows the amperometric results of the glucose addition at 180 s periods for the GC electrode. These results clearly show that the GC electrode showed no current response with the addition of glucose solution.
Carbon NanoFiber Detection As previously stated, the GC electrode was used as a benchmark for the study of the primary CNF electrode. Although the GC electrode showed no response to glucose, the CNF electrode successfully detected glucose and the signal response was linear. Nonetheless, several points of interest are provided to describe certain challenges.
Detection Demonstrated As shown in FIG. 17, the results of the current response of the CNFs to the addition of glucose at stock concentrations of 0.1, 0.25, 0.5 and 1 M are provided. In FIG. 17, raw signals from the sensor are provided. The results show an instantaneous and sharp increase in current with the addition of glucose. The results suggest that the electrode is stable and the experiment is reproducible. The intensity of the peaks increases as the glucose concentration increases suggesting that the electrode not only detects the presence of glucose but also responds such that it can be calibrated to determine the glucose concentration.

Figure 19:
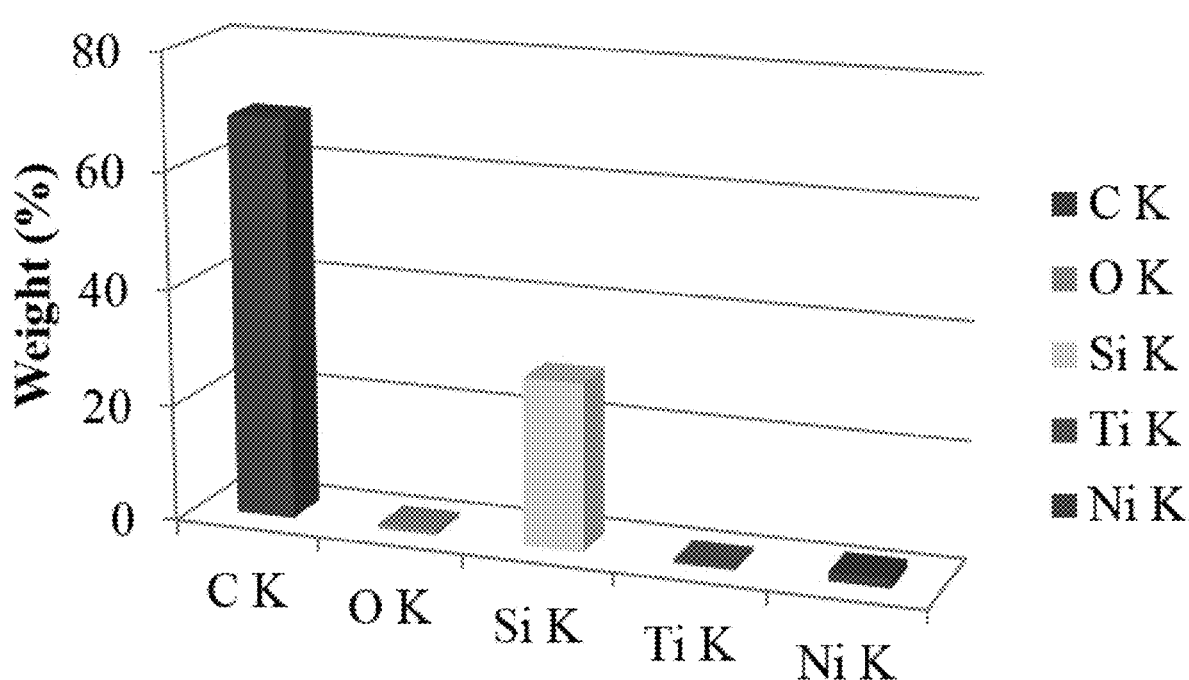
FIG. 19 provides a distribution map of where the nickel is presented in the CNF electrode.
Figure 20:
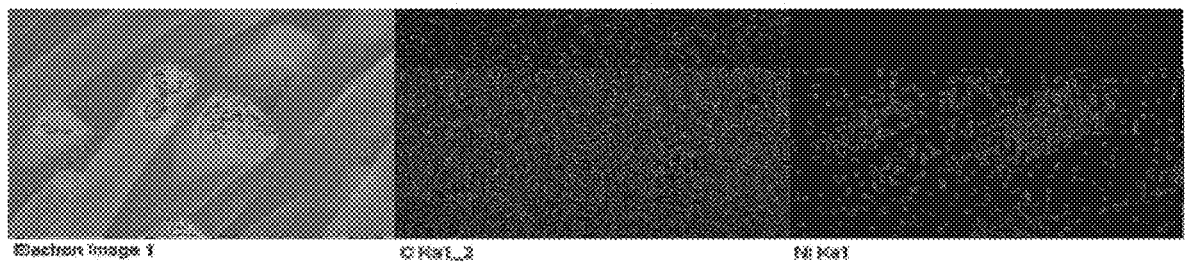
FIG. 20 provides a SEM Image of CNFs and the distribution map for the carbon and nickel content.

FIG. 19 shows the detector signal versus the glucose concentration. This graph was prepared by first calculating the concentration of glucose in the cell based on the concentration and volume of the stock solution added to the test cell as well as the final volume of liquid in the cell. These values represent the x-axis coordinates for the data shown in FIG. 19. Next, the area under the signal peak was integrated to determine the charge (µC) corresponding to a particular dose of glucose. These values represent the y-axis coordinates for the data shown. The graph shows a good linear relationship between the detector signal and the glucose concentration. Although a linear signal is observed, the uncertainty in the measurement is fairly large at low concentrations. This is attributed to the variability that remains with the improved dosing method. Additionally, use of adequate mixing creates additional sources of noise in the signal that ultimately increases uncertainty with the measurement.
Detection Mechanism Two mechanisms were considered to explain the non-enzymatic detection of glucose: nickel catalysis and increased reaction rate due to the high surface area of the CNFs. As previously described, the CNFs were grown from a nickel catalyst. This is important because, in the non-enzymatic glucose detection literature (Dhara et al. 2014; Kiani et al. 2014; Shervedani et al. 2014; Tarlani et al. 2014), there are examples of testing platforms that contain nickel in the electrode that have detected glucose without the aid of the glucose oxidase enzyme. The explanation is that the reaction is catalyzed by a nickel redox reaction. For this reason, nickel catalysis was the first mechanism considered. To evaluate this mechanism, EDS studies were conducted to confirm the presence of nickel in the electrode. The EDS results shown in Table 1 and graphically in FIG. 19 indicate that the materials present in the sample are as follows: 68.51% carbon, 28.62% silicon, 1.60% nickel, 0.71% oxygen and 0.56% titanium. FIG. 20 provides a distribution map which illustrates where the nickel is present in the material; this is observed by the bright dots. The mapping distribution was completed for carbon as well and the presence of carbon was observed by the intense bright dots. Thus, the presence of nickel in the electrode was confirmed.

TABLE 1

EDS Composition of CNFs Material

| Element | App Conc. | Intensity Correlation | Weight % | Weight % Sigma | Atomic % |
|---|---|---|---|---|---|
| C | 19.12 | 0.3315 | 68.51 | 0.35 | 83.81 |
| O | 0.18 | 0.2994 | 0.71 | 0.15 | 0.65 |
| Si | 25.16 | 1.0441 | 28.62 | 0.31 | 14.97 |
| Ti | 0.37 | 0.7881 | 0.56 | 0.04 | 0.17 |
| Ni | 1.07 | 0.7978 | 1.60 | 0.08 | 0.4 |
| Totals | | | 100 | | |

Figure 21:
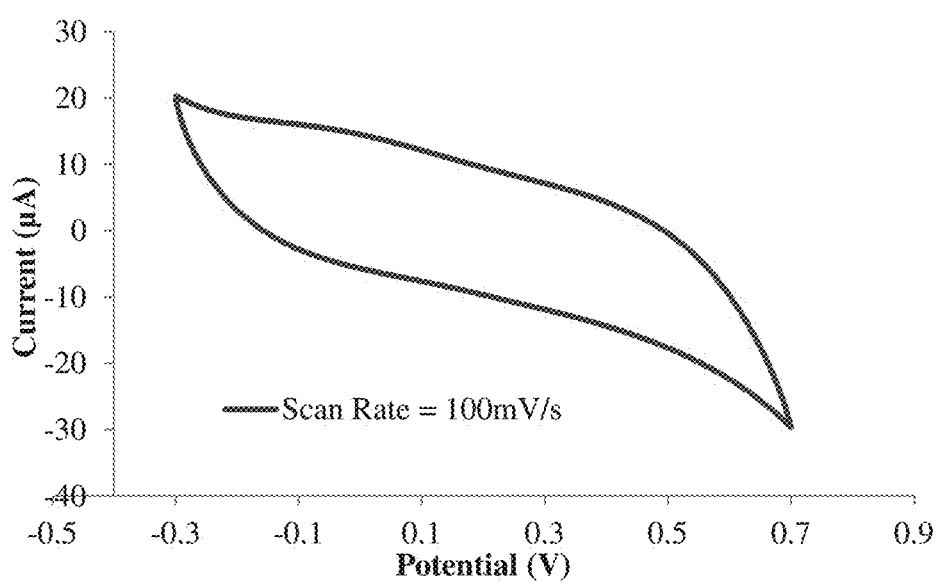
FIG. 21 illustrates the CV data for CNFs electrode, showing no indication of nickel redox/oxidation peaks.

Next, the nickel redox reaction was evaluated using cyclic voltammetry. The results reflected in FIG. 21 clearly show no indication of redox/oxidation peaks for the presence of nickel.

Without direct evidence of the nickel catalysis mechanism, the second mechanism of a faster reaction rate facilitated by a high surface area was evaluated to explain the ability of this material to oxidize glucose without the aid of the enzyme glucose oxidase. The surface area of the GC electrode is 12.5 mm$^2$ whereas the surface area of the CNF electrode is 105 mm$^2$. The glucose oxidation is thermodynamically favorable, but it is typically too slow to observe without a biological catalyst such as glucose oxidase. In the case of the CNF sensor, the evidence supports that the area is large enough to help overcome the slow reaction rate in the absence of a catalyst.

Sensitivity Determination

The electrode sensitivity was calculated using the following equation (Dhara et al. 2014; Kiani et al. 2014; Shervedani et al. 2014; Tarlani et al. 2014): Sensitivity=m/A, where m=the slope from the graph of the detector signal versus the glucose concentration and A=the two dimensional surface area of the CNF electrodes.

Based on the above equation, the sensitivity of the CNFs is ~795.2 µC/mM-cm$^2$. However, a peak current was observed in contrast to the limiting current that is often observed in studies from the literature. Integrating under the peak allowed the signal to be correlated to glucose concentration, but the sensitivity has different units than what is typical in the literature. To address this lack of consistency, in addition to the aforementioned sensitivity calculation, the peak current value was substituted for the limiting current to calculate sensitivity in comparable units. Using this approach, the sensitivity of the CNFs is 2.7 µA/mM cm$^2$.

Detection Limit

The following equation was used to determine the signal to noise ratio (Ripp, 1996):

$$\left(\frac{S}{N}\right) = X_{AVE}/s$$

where $X_{AVE}$=average of either the calculated concentrations or analytical signals, s=standard deviation.

The lowest concentration of glucose solution added to the testing cell that showed a current was 0.1 M corresponding to 2 mM after being added to the testing cell. Accordingly, the detection limit is 2 mM (S/N=1).

Selectivity Experimentation

Figure 22:
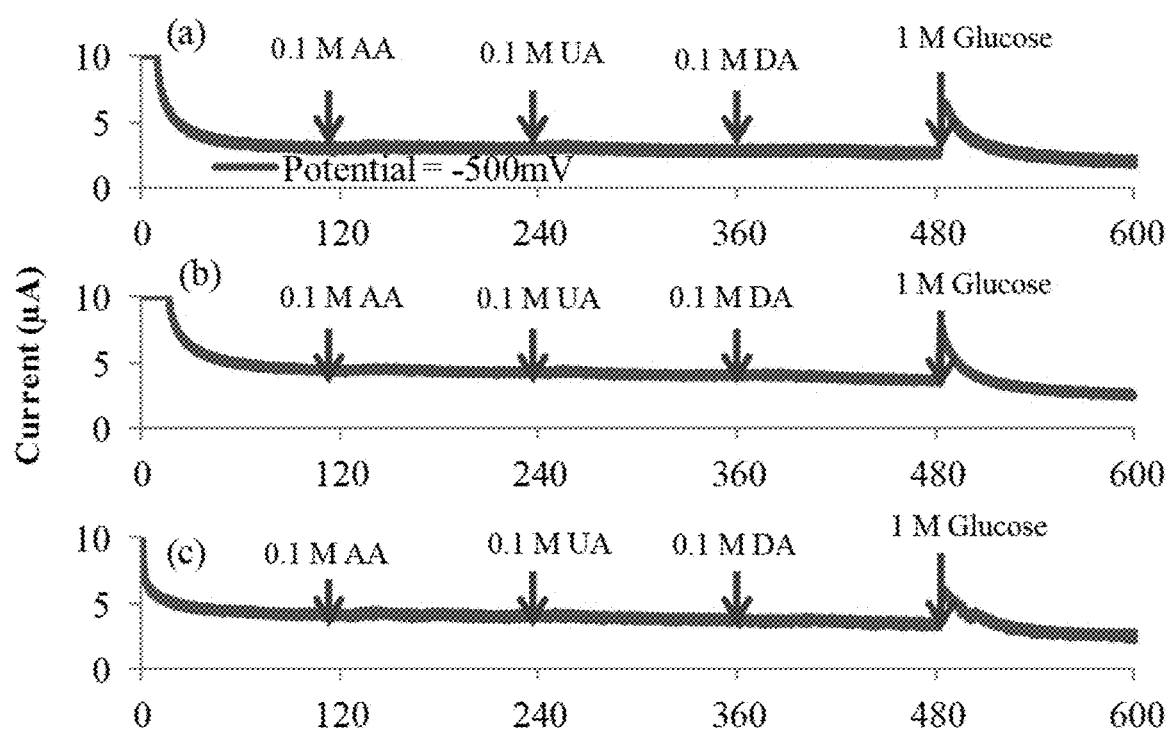
FIG. 22 illustrates the results of the amperometric study of CNFs electrodes current response to interfering reagents.

For the selectivity experiments, three known interfering reagents, uric acid (UA), ascorbic acid (AA), and dopamine (DA) were evaluated. These reagents are known to have similar electroactivities to glucose, which causes interference in the detection of glucose (Kani et al., 2014). However, the concentration of glucose in the human blood is approximately 30 times the concentration of AA, UA and DA (Wang et al. 2009). Thus, the interfering agents were added in quantities with physiological relevance. FIG. 22 shows the selectivity results where 0.1 M of AA (120 s), UA (240 s), DA (360 s), and 1 M glucose solution (480 s) were added. The results showed that the interfering reagents showed no current response but a signal was observed with the addition of glucose solution, which suggests that the electrode is selective for glucose in the presence of interfering compounds at concentrations that are physiologically relevant.

The various preferred embodiments and experiments having thus been described, those skilled in the art will readily appreciate that various modifications and variations can be made to the aforementioned preferred embodiments without departing from the spirit and scope of the invention. The invention thus will only be limited to the claims as ultimately granted.

The invention claimed is:

1. A non-enzymatic glucose sensor, comprising an electrode having carbon nanofibers on a transition-metal coated silicon substrate, wherein the carbon nanofibers after growth are not further modified.

2. The sensor of claim 1 wherein the carbon nanofibers have diameters between 13 to 160 nm.

3. The sensor of claim 2 wherein the diameter of the carbon nanofibers is between 60 to 70 nm.

4. The sensor of claim 2, wherein the carbon nanofibers have a density of 40 fibers/µm$^2$.

5. The sensor of claim 1, wherein the electrode surface area is at least 100 mm$^2$.

6. The sensor of claim 1 wherein the electrode capacitance is 0.2 µc/mV.

7. A method for detecting glucose in a sample, comprising:
   contacting one or more sensors of claim 1 with a sample under conditions sufficient to allow the sample to contact the sensors; and detecting glucose, wherein detection of glucose indicates the presence of glucose in the sample.

8. The method of claim 7 wherein the electrode is comprised of carbon nanofibers having diameters between 13 to 160 nm.

9. The method of claim 7 wherein an amount of glucose in the sample is between 10 to 2,000 mg/dL.

10. The method of claim 7 wherein the sample is selected from the group consisting of saliva, blood or urine.

11. A kit comprising: one or more non-enzymatic glucose sensors of claim 1 and at least one table for correlating detected glucose level.

12. A method for detecting hydrogen peroxide in a sample, comprising: contacting one or more sensors of claim 1 with a sample under conditions sufficient to allow the sample to bind to the sensor; detecting hydrogen peroxide, wherein detection of hydrogen peroxide indicates the presence of hydrogen peroxide in the sample.

13. A non-enzymatic hydrogen peroxide sensor, comprising an electrode having carbon nanofibers on a transition-metal and metal oxide coated silicon substrate, wherein the carbon nanofibers after growth are not further modified.

\* \* \* \* \*